US011302235B2

(12) United States Patent
Lee et al.

(10) Patent No.: US 11,302,235 B2
(45) Date of Patent: Apr. 12, 2022

(54) DISPLAY DEVICE AND AN OPERATING METHOD OF A CONTROLLER OF THE DISPLAY DEVICE

(71) Applicant: SAMSUNG DISPLAY CO., LTD., Yongin-si (KR)

(72) Inventors: Dukjin Lee, Yongin-si (KR); Beonghun Beon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/915,086

(22) Filed: Jun. 29, 2020

(65) Prior Publication Data

US 2021/0183296 A1 Jun. 17, 2021

(30) Foreign Application Priority Data

Dec. 16, 2019 (KR) ........................ 10-2019-0168148

(51) Int. Cl.
*G09G 3/32* (2016.01)
*G09G 3/20* (2006.01)
*H01L 27/32* (2006.01)
*H01L 51/52* (2006.01)

(52) U.S. Cl.
CPC ............. *G09G 3/2003* (2013.01); *G09G 3/32* (2013.01); *G09G 2320/0233* (2013.01);
(Continued)

(58) Field of Classification Search
CPC ...... G09G 3/2003; G09G 3/32; G09G 3/3208; G09G 3/3233; G09G 3/3241; G09G 3/325;
(Continued)

(56) References Cited

U.S. PATENT DOCUMENTS 7,352,350 B2 * 4/2008 Nitta .................... G09G 3/3406
315/169.3
8,519,910 B2 * 8/2013 Park ..................... G09G 3/2003
345/48
(Continued)

FOREIGN PATENT DOCUMENTS

KR 10-2015-0048602 5/2015
KR 10-1805621 12/2017
(Continued)

*Primary Examiner* — Vijay Shankar
(74) *Attorney, Agent, or Firm* — F. Chau & Associates, LLC

(57) ABSTRACT

A display device including: a display panel including first and second display areas, the first display area including first pixels, the second display area including second pixels and a transmission area; a memory storing correction values of a pixel value; a controller generating corrected data by correcting image data using the correction values of the pixel value; and a data driver outputting a data signal corresponding to the corrected data to the display panel, wherein one of the correction values of the pixel value includes a pixel function value for illuminance of external light regarding one of the first pixels and the second pixels, the pixel function value makes a white color coordinate of the first display area equal to a white color coordinate of the second display area based on an external light characteristic, an external light reflection characteristic, and an emission characteristic.

21 Claims, 15 Drawing Sheets

(52) U.S. Cl.
CPC .......... *G09G 2320/0626* (2013.01); *G09G 2320/0673* (2013.01); *G09G 2360/144* (2013.01); *H01L 27/3246* (2013.01); *H01L 51/5218* (2013.01)

(58) Field of Classification Search
CPC ......... G09G 3/3258; G09G 2310/0278; G09G 2320/0233; G09G 2320/0626; G09G 2320/0673; G09G 2330/028; G09G 2360/144; H01L 27/3246; H01L 51/5218
See application file for complete search history.

(56) References Cited

U.S. PATENT DOCUMENTS

| | | | |
|---|---|---|---|
| 9,001,010 B2 | 4/2015 | Jeon | |
| 9,083,919 B2 | 7/2015 | Kim et al. | |
| 9,972,243 B2* | 5/2018 | Lee | G09G 3/003 |
| 10,205,934 B2* | 2/2019 | Jung | H04N 13/344 |
| 10,748,479 B2* | 8/2020 | Kurokawa | H01L 27/0203 |
| 10,911,734 B2* | 2/2021 | Park | G09G 3/3233 |
| 2017/0153695 A1* | 6/2017 | Kawashima | G06F 1/1643 |
| 2018/0089485 A1 | 3/2018 | Bok | |
| 2019/0103062 A1 | 4/2019 | Li | |
| 2019/0333445 A1* | 10/2019 | Kurokawa | G09G 3/20 |

FOREIGN PATENT DOCUMENTS

| | | |
|---|---|---|
| KR | 10-2018-0033361 | 4/2018 |
| KR | 10-2019-0088159 | 7/2019 |
| KR | 10-2009724 | 8/2019 |

\* cited by examiner

POWER OFF

POWER ON

DISPLAY DEVICE AND AN OPERATING METHOD OF A CONTROLLER OF THE DISPLAY DEVICE

CROSS-REFERENCE TO RELATED APPLICATION

This application claims priority under 35 U.S.C. 119 to Korean Patent Application No. 10-2019-0168148, filed on Dec. 16, 2019, in the Korean Intellectual Property Office, the disclosure of which is incorporated by reference herein in its entirety.

1. TECHNICAL FIELD

Exemplary embodiments of the inventive concept relate to a display device and an operating method of a controller of the display device, and more particularly, to a display device including an extended display area such that an image may be displayed in a region where an electronic component is arranged, and an operating method of a controller of the display device.

2. DESCRIPTION OF RELATED ART

Recently, use of display devices has been diversified. In addition, as display devices have become thinner and lighter, their range of use has gradually been extended. For example, display devices are employed in various devices such as mobile devices including smartphones, tablets and wearable tech, as well as stationary device including kiosks and smart appliances.

As display devices are used in various ways, they have been designed to have various shapes. For example, although typically flat, display devices are being designed to have curved edges and/or bendable features. In addition, functions that may be combined or associated with the display devices are increasing.

SUMMARY

According to an exemplary embodiment of the inventive concept, a display device includes: a display panel including a first display area and a second display area, the first display area including first pixels and the second display area including second pixels and a transmission area; a memory storing correction values of a pixel value; a controller configured to generate corrected data by correcting image data based on the correction values of the pixel value provided from the memory; and a data driver outputting a data signal corresponding to the corrected data to the display panel, wherein at least one of the correction values of the pixel value includes a pixel function value for illuminance of external light with respect to at least one of the first pixels and the second pixels, wherein the pixel function value makes a white color coordinate of the first display area equal to a white color coordinate of the second display area based on an external light characteristic, an external light reflection characteristic of the first display area and the second display area, and an emission characteristic of the first display area and the second display area.

The correction values of the pixel value may include values that are obtained based on a ratio of correction of luminance of the second pixels that makes the white color coordinate of the second display area equal to the white color coordinate of the first display area.

The controller may be further configured to output first image data of the first pixels to the data driver, generate corrected data by correcting second image data of the second pixels based on an input value for the illuminance of external light and a correction value of a pixel value corresponding to the input value, and output the corrected data to the data driver.

The memory may store correction values of a gamma value, wherein the correction values of the gamma value include correction values of a gamma value of the second display area that are obtained based on the ratio of correction of luminance of the second pixels.

The controller may be further configured to simultaneously load the correction value of the gamma value corresponding to the input value from the memory and output a corrected gamma value reflecting the correction value of the gamma value corresponding to the input value to a gamma value set in advance to the data driver, and the data driver may output a data signal reflecting the corrected gamma value to the corrected data to the second pixels.

The correction values of the pixel value may include correction values of a pixel value obtained based on a ratio of correction of luminance of the first pixels and correction values of a pixel value obtained based on a ratio of correction of luminance of the second pixels, wherein the ratio of correction of luminance of the first pixels and the ratio of correction of luminance of the second pixels each make the white color coordinate of the first display area and the white color coordinate of the second display area equal to a reference white color coordinate.

The controller may be further configured to generate first corrected data by correcting first image data of the first pixels based on an input value of illuminance of external light and a correction value of a pixel value corresponding to the input value and output the first corrected data to the data driver, and generate second corrected data by correcting second image data of the second pixels based on the input value of the illuminance of external light and the correction value of the pixel value corresponding to the input value and output the second corrected data to the data driver.

The memory may further store correction values of a gamma value, wherein the correction values of the gamma value include correction values of a gamma value of the first display area obtained based on the ratio of correction of luminance of the first pixels and correction values of a gamma value of the second display area obtained based on the ratio of correction of luminance of the second pixels.

The controller may be further configured to simultaneously load the correction values of the gamma value stored in the memory, the correction values of the gamma value corresponding to the input value of illuminance of external light, and output corrected gamma values reflecting the correction values of the gamma value to gamma values set in advance to the data driver, and the data driver may output a data signal reflecting the corrected gamma values to the corrected data to the first pixels and the second pixels.

The external light characteristic may include an external light spectrum and illuminance of external light, wherein the external light spectrum is a luminance value depending on a wavelength of the external light, the external light reflection characteristic of the first display area includes a first reflection spectrum, which is a reflectivity depending on a wavelength of the external light in the first display area, the external light reflection characteristic of the second display area includes a second reflection spectrum, which is a reflectivity depending on a wavelength of the external light in the second display area, the emission characteristic of the first display area includes a first emission spectrum, which is a luminance value depending on a wavelength of light emitted by the first pixels, and the emission characteristic of the second display area includes a second emission spectrum, which is a luminance value depending on a wavelength of light emitted by the second pixels.

The display device may further include: a first display unit arranged in the first display area and including the first pixels; and a second display unit arranged in the second display area and including the second pixels and the transmission area around the second pixels, wherein no pixel is arranged in the transmission area, wherein each of the first display unit and the second display unit includes an emission area and a non-emission area, the emission area emitting light, and the non-emission area surrounding the emission area, the first reflection spectrum is obtained based on an area ratio of the emission area and the non-emission area of the first display unit, and a reflectivity of the external light in the emission area and the non-emission area of the first display unit, and the second reflection spectrum is obtained based on an area ratio of the emission area, the non-emission area, and the transmission area of the second display unit, a reflectivity of the external light in the emission area and the non-emission area of the second display unit, and a reflectivity and transmittance of the external light in the transmission area.

The white color coordinate of the first display area may be obtained based on the external light characteristic, the external light reflection characteristic of the first display area, and the emission characteristic of the first display area, and the white color coordinate of the second display area may be obtained based on the external light characteristic, the external light reflection characteristic of the second display area, and the emission characteristic of the second display area.

The display device may further include an illuminance sensor measuring illuminance of external light, wherein the controller may be further configured to receive an input value of the illuminance of external light from the illuminance sensor.

The display device may further include an electronic component overlapping the transmission area of the second display area.

According to an exemplary embodiment of the inventive concept, an operating method of a controller includes: receiving, at the controller, an input of an external light characteristic; loading, at the controller, correction values of a pixel value corresponding to the input among the correction values of the pixel value stored in a memory; loading, at the controller, correction values of a gamma value corresponding to the input among correction values of the gamma value stored in the memory; generating, at the controller, corrected data by correcting at least one of a first image data of first pixels and a second image data of second pixels based on the input and the loaded correction values of the pixel value, and outputting the corrected data to a data driver; and outputting, from the controller, a corrected gamma value reflecting the correction value of the gamma value to a gamma value set in advance to the data driver, wherein the correction value of the pixel value includes a pixel function value for illuminance of external light with respect to at least one of the first pixels and the second pixels, the pixel function value making a white color coordinate of a first display area equal to a white color coordinate of a second display area based on an external light characteristic, an external light reflection characteristic of the first display area and the second display area, and an emission characteristic of the first display area and the second display area, wherein the display device include: a display panel including a first display area and a second display area, the first display area including first display units including the first pixels and the second display area including second display units including the second pixels and a transmission area; the memory, the controller and the data driver.

The correction values of the pixel value may include values that are obtained based on a ratio of correction of luminance of the second pixels that makes the white color coordinate of the second display area equal to the white color coordinate of the first display area, and the correction values of the gamma value may include correction values of a gamma value of the second display area that obtained based on a ratio of correction of luminance of the second pixels.

The correction values of the pixel value may include correction values of a pixel value that are obtained based on a ratio of correction of luminance of the first pixels and correction values of a pixel value that are obtained based on a ratio of correction of luminance of the second pixels, wherein the ratio of correction of luminance of the first pixels and the ratio of correction of luminance of the second pixels each make the white color coordinate of the first display area and the white color coordinate of the second display area equal to a reference white color coordinate, and the correction values of the gamma value may include correction values of a gamma value of the first display area that are obtained based on the ratio of correction of luminance of the first pixels and correction values of a gamma value of the second display area that are obtained based on the ratio of correction of luminance of the second pixels.

The external light characteristic may include an external light spectrum and illuminance of external light, wherein the external light spectrum is a luminance value depending on a wavelength of external the light, the external light reflection characteristic of the first display area includes a first reflection spectrum, which is a reflectivity depending on a wavelength of the external light in the first display area, the external light reflection characteristic of the second display area includes a second reflection spectrum, which is a reflectivity depending on a wavelength of the external light in the second display area, the emission characteristic of the first display area includes a first emission spectrum, which is a luminance value depending on a wavelength of light emitted by the first pixels, and the emission characteristic of the second display area includes a second emission spectrum, which is a luminance value depending on a wavelength of light emitted by the second pixels.

Each of the first display unit and the second display unit includes an emission area and a non-emission area, the emission area emitting light, and the non-emission area surrounding the emission area, the first reflection spectrum is obtained based on an area ratio of the emission area and the non-emission area of the first display unit, and a reflectivity of the external light in the emission area and the non-emission area of the first display unit, and the second reflection spectrum is obtained based on an area ratio of the emission area, the non-emission area, and the transmission area of the second display unit, a reflectivity of the external light in the emission area and the non-emission area of the second display unit, and a reflectivity and transmittance of the external light in the transmission area.

The white color coordinate of the first display area may be obtained based on the external light characteristic, the external light reflection characteristic of the first display area, and the emission characteristic of the first display area, and the white color coordinate of the second display area may be obtained based on the external light characteristic, the external light reflection characteristic of the second display area, and the emission characteristic of the second display area.

According to an exemplary embodiment of the inventive concept, a display device includes: a display panel including a first display area and a second display area, the first display area including first pixels and the second display area including second pixels and a transmission area; a memory storing correction values of a pixel value; a controller generating corrected data by correcting image data based on the correction values of the pixel value provided from the memory; and a data driver outputting a data signal corresponding to the corrected data to the display panel, wherein at least one of the correction values of the pixel value includes a pixel function value for illuminance of external light with respect to at least one of the first pixels and the second pixels, wherein the pixel function value makes a white color coordinate of the first display area equal to a white color coordinate of the second display area based on an external light characteristic and at least one of an external light reflection characteristic of the first display area, an external light reflection characteristic of the second display area, an emission characteristic of the first display area and an emission characteristic of the second display area.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
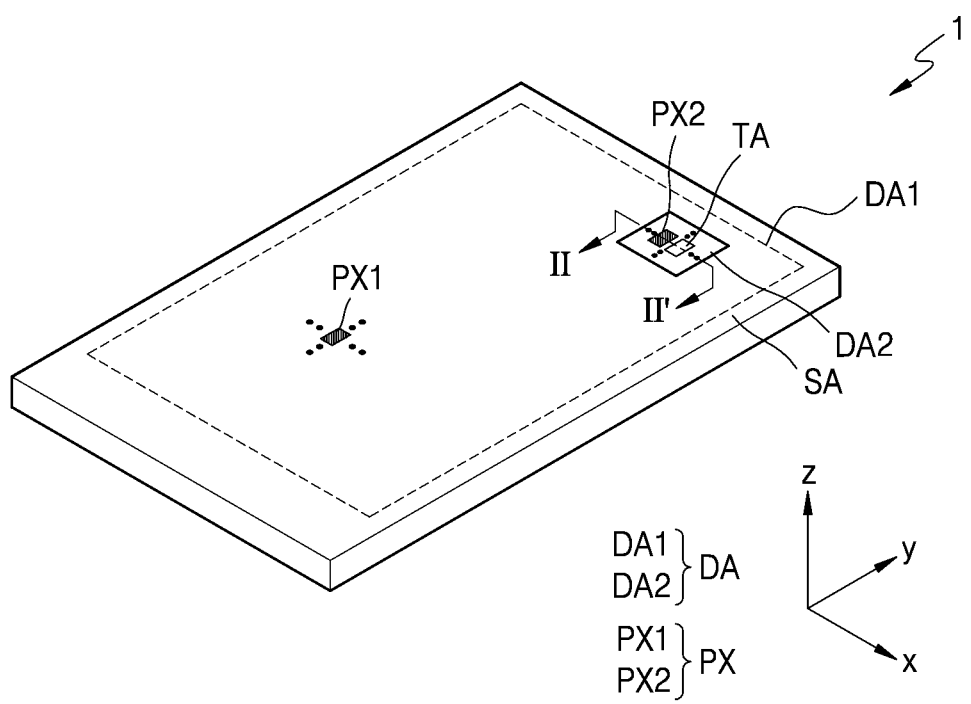
FIG. 1 is a perspective view of a display device according to an exemplary embodiment of the inventive concept.

Reference will now be made in detail to exemplary embodiments of the inventive concept which are illustrated in the accompanying drawings, wherein like reference numerals may refer to like elements throughout. It is to be understood that the inventive concept may have different forms and should not be construed as being limited to the embodiments set forth herein.

As used herein, the singular forms "a," "an," and "the" are intended to include the plural forms as well, unless the context clearly indicates otherwise.

It will be understood that when a layer, region, or component is referred to as being "formed on," another layer, region, or component, it can be directly or indirectly formed on the other layer, region, or component. In other words, for example, intervening layers, regions, or components may be present.

Sizes of elements in the drawings may be exaggerated or reduced for convenience of explanation.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with the other layer, region, or component interposed therebetween. In the following examples, the x-axis, the y-axis and the z-axis are not limited to three axes of the rectangular coordinate system. For example, the x-axis, the y-axis, and the z-axis may be perpendicular to one another, or may represent different directions that are not perpendicular to one another.

FIG. 1 is a perspective view of a display device 1 according to an exemplary embodiment of the inventive concept.

The display device 1 according to embodiments of the inventive concept may be implemented as electronic apparatuses including smartphones, mobile phones, smartwatches, navigation apparatuses, game consoles, televisions, a head unit for automobiles, notebook computers, laptop computers, tablet computers, personal media players (PMP), and personal digital assistants (PDA). In addition, the electronic apparatuses may include flexible apparatuses.

Referring to FIG. 1, the display device 1 includes a first display area DA1, a second display area DA2, and a surrounding area SA, the first display area DA1 and the second display area DA2 each emitting light, and the surrounding area SA not emitting light. The second display area DA2 may be arranged adjacent to the first display area DA1, and the surrounding area SA may be arranged outside the first display area DA1. The first display area DA1 and the second display area DA2 may be collectively referred to display areas DA.

In an exemplary embodiment of the inventive concept, it is shown in FIG. 1 that one second display area DA2 is arranged inside the first display area DA1. In another exemplary embodiment of the inventive concept, the number of second display areas DA2 may be two or more, and the shapes and the sizes of the second display areas DA2 provided in plural may be different from each other. The surrounding area SA may include a non-display area in which pixels are not arranged. The first display area DA1 may be entirely or partially surrounded by the surrounding area SA.

Though it is shown in FIG. 1 that the second display area DA2 is approximately quadrangular, the inventive concept is not limited thereto. In a plan view (e.g., when viewed in a direction perpendicular to one surface of a substrate), a shape of each of the second display areas DA2 may be variously modified such as a circle, an ellipse, a polygonal including a quadrangle, a star-shape, and a diamond shape.

In addition, it is shown in FIG. 1 that the second display area DA2 is arranged on one side (e.g., a top right side) of the first display area DA1, which has a quadrangular shape. However, the inventive concept is not limited thereto. In another exemplary embodiment of the inventive concept, the second display area DA2 may be arranged on one side (e.g., a top left side or a top center) of the first display area DA1, which has a quadrangular shape.

Furthermore, though it is shown in FIG. 1 that the second display area DA2 is entirely surrounded by the first display area DA1, the inventive concept is not limited thereto. In another exemplary embodiment of the inventive concept, the second display area DA2 may be partially surrounded by the first display area DA1, and a side of the second display area DA2 that is not surrounded by the first display area DA1 may be surrounded by the surrounding area SA.

Hereinafter, though the display device 1 according to an exemplary embodiment of the inventive concept is described as including an organic light-emitting display panel, the inventive concept is not limited thereto. In another exemplary embodiment of the inventive concept, the display device 1 may include various types of display devices such as inorganic light-emitting display panels and quantum dot light-emitting display panels. For example, an emission layer of a display element provided to the display device 1 may include an organic material, include an inorganic material, include quantum dots, include an organic material and quantum dots, or include an inorganic material and quantum dots.

The display device 1 includes an array of a plurality of pixels PX arranged over a substrate 100. The plurality of pixels PX may include first pixels PX1 and second pixels PX2, the first pixels PX1 being arranged in the first display area DA1, and the second pixels PX2 being arranged in the second display area DA2.

Each of the first pixel PX1 and the second pixel PX2 may emit light having a predetermined color from an organic light-emitting diode OLED. Each organic light-emitting diode OLED may emit, for example, red, green, or blue light. Each organic light-emitting diode OLED may be connected to a pixel circuit including a transistor and a capacitor.

The first pixels PX1 may be arranged two-dimensionally in the first display area DA1, and the second pixels PX2 may be arranged two-dimensionally in the second display area DA2. A transmission area TA is arranged in the second display area DA2. The transmission area TA may be arranged between second pixels PX2 that neighbor each other.

The display device 1 may display a predetermined image by using light emitted from the plurality of pixels PX arranged in the first display area DA1 and the second display area DA2. The display device 1 may display a first image (or a main image) by using light emitted from the plurality of first pixels PX1 arranged in the first display area DA1 and display a second image (or an auxiliary image) by using light emitted from the plurality of second pixels PX2 arranged in the second display area DA2. The first image and the second image may respectively correspond to portions of one image or respectively be independent images. A resolution of the second image displayed in the second display area DA2 may be less than a resolution of the first image displayed in the first display area DA1.

The display device 1 may include an electronic component located in the second display area DA2, and the second display area DA2 may include the transmission area TA for driving of the electronic component.

Figure 2:
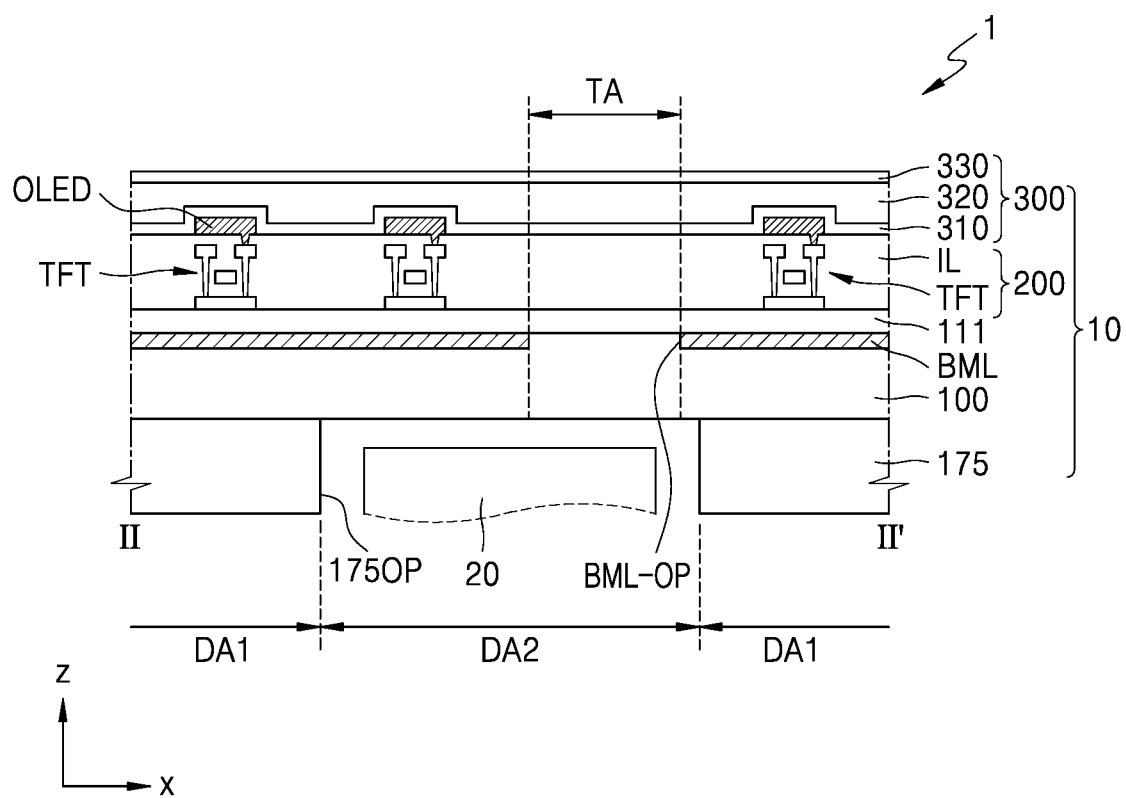
FIG. 2 is a cross-sectional view of a portion of a display device according to an exemplary embodiment of the inventive concept.

FIG. 2 is a cross-sectional view of a portion of the display device 1 according to an exemplary embodiment of the inventive concept.

Referring to FIG. 2, the display device 1 may include a display panel 10 and an electronic component 20 overlapping the display panel 10.

The display panel 10 may include the substrate 100, a display layer 200 on the substrate 100, a thin-film encapsulation layer 300 on the display layer 200, and a light-blocking layer BML.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including the polymer resin may be flexible, rollable, or bendable. The substrate 100 may have a multi-layered structure including a layer including the polymer resin, and an inorganic layer. In another exemplary embodiment of the inventive concept, the substrate 100 may include a transparent insulating substrate including materials such as glass and quartz and have a single-layered structure.

The display layer 200 may be arranged on a first surface of the substrate 100, and a bottom protective film 175 may be arranged on a second surface opposite to the first surface of the substrate 100. The bottom protective film 175 may be attached on the second surface of the substrate 100. An adhesive layer may be arranged between the bottom protective film 175 and the substrate 100. Alternatively, the bottom protective film 175 may be directly formed on the second surface of the substrate 100. In this case, an adhesive layer may not be arranged between the bottom protective film 175 and the substrate 100.

The bottom protective film 175 may support and protect the substrate 100. The bottom protective film 175 may include an opening 1750P corresponding to the second display area DA2. The bottom protective film 175 may improve a transmittance of the second display area DA2, for example, a light transmittance of the transmission area TA by including the opening 1750P. The bottom protective film 175 may include polyethylene terephthalate (PET) or polyimide (PI).

The display layer 200 may include a circuit layer, a display element layer, and an insulating layer IL, the circuit layer including a thin film transistor TFT, and the display element layer including an organic light-emitting diode OLED, which is a display element. A thin film transistor TFT and an organic light-emitting diode OLED electrically connected to the thin film transistor TFT may be arranged in each of the first display area DA1 and the second display area DA2. The second display area DA2 may include the transmission area TA in which the thin film transistor TFT and the organic light-emitting diode OLED are not arranged. In addition, the transmission area TA may not include the light-blocking layer BML.

The transmission area TA is a region through which light output from the electronic component 20 and/or directed to the electronic component 20 may pass. A transmittance of the transmission area TA may 50% or more, 60% or more, 75% or more, 80% or more, 85% or more, or 90% or more.

A buffer layer 111 may be arranged between the substrate 100 and the display layer 200.

The thin-film encapsulation layer 300 may include at least one inorganic encapsulation layer and at least one organic encapsulation layer. In an exemplary embodiment of the inventive concept, the thin-film encapsulation layer 300 may include first and second inorganic encapsulation layers 310 and 330 and an organic encapsulation layer 320 therebetween.

The light-blocking layer BML may be arranged between the substrate 100 and the display layer 200. For example, the light-blocking layer BML may be arranged, for example, between the thin film transistor TFT and the substrate 100. In addition, the light-blocking layer BML may be disposed between the buffer layer 111 and the first surface of the substrate 100.

The light-blocking layer BML may include an opening BML-OP corresponding to the transmission area TA. The light-blocking layer BML may include the opening BML-OP and include a portion including a light-blocking material (e.g., a metal or black ink, etc.). The portion of the light-blocking layer BML including the light-blocking material may cover the first display area DA1 and a portion of the second display area DA2. A portion of the light-blocking layer BML that covers the first display area DA1 and the portion of the light-blocking layer BML that covers a portion of the second display area DA2 may be connected to each other as one body. For example, the light-blocking layer BML may be arranged to correspond to the first display area DA1 of the display panel 10 and an entire region of the second display area DA2 except the transmission area TA.

As shown in FIG. 2, the light-blocking layer BML may be arranged on the substrate 100. Alternatively, the light-blocking layer BML may be arranged in a multi-layered structure of the substrate 100. For example, the light-blocking layer BML may be arranged between a plurality of sub-layers constituting the substrate 100.

The electronic component 20 may be located in the second display area DA2. The electronic component 20 may include an electronic element that uses light or sound. For example, the electronic element may include a sensor for measuring a distance such as a proximity sensor, a sensor for recognizing a portion (e.g., a fingerprint, an iris, a face, etc.) of a user's body, a small lamp for outputting light, or an image sensor (e.g., a camera) that captures an image. The electronic element that uses light may use light in various wavelength bands including visible light, infrared light, and ultraviolet light. The electronic element that uses sound may use ultrasonic waves or sound in other frequency bands.

One electronic element 20 or a plurality of electronic elements 20 may be arranged in the second display area DA2. In an exemplary embodiment of the inventive concept, the electronic component 20 may include a light emitter and a light receiver. The light emitter and the light receiver may be provided as one integrated structure or a pair of a light emitter and a light receiver respectively having physically separated structures may constitute one electronic component 20.

Figure 3:
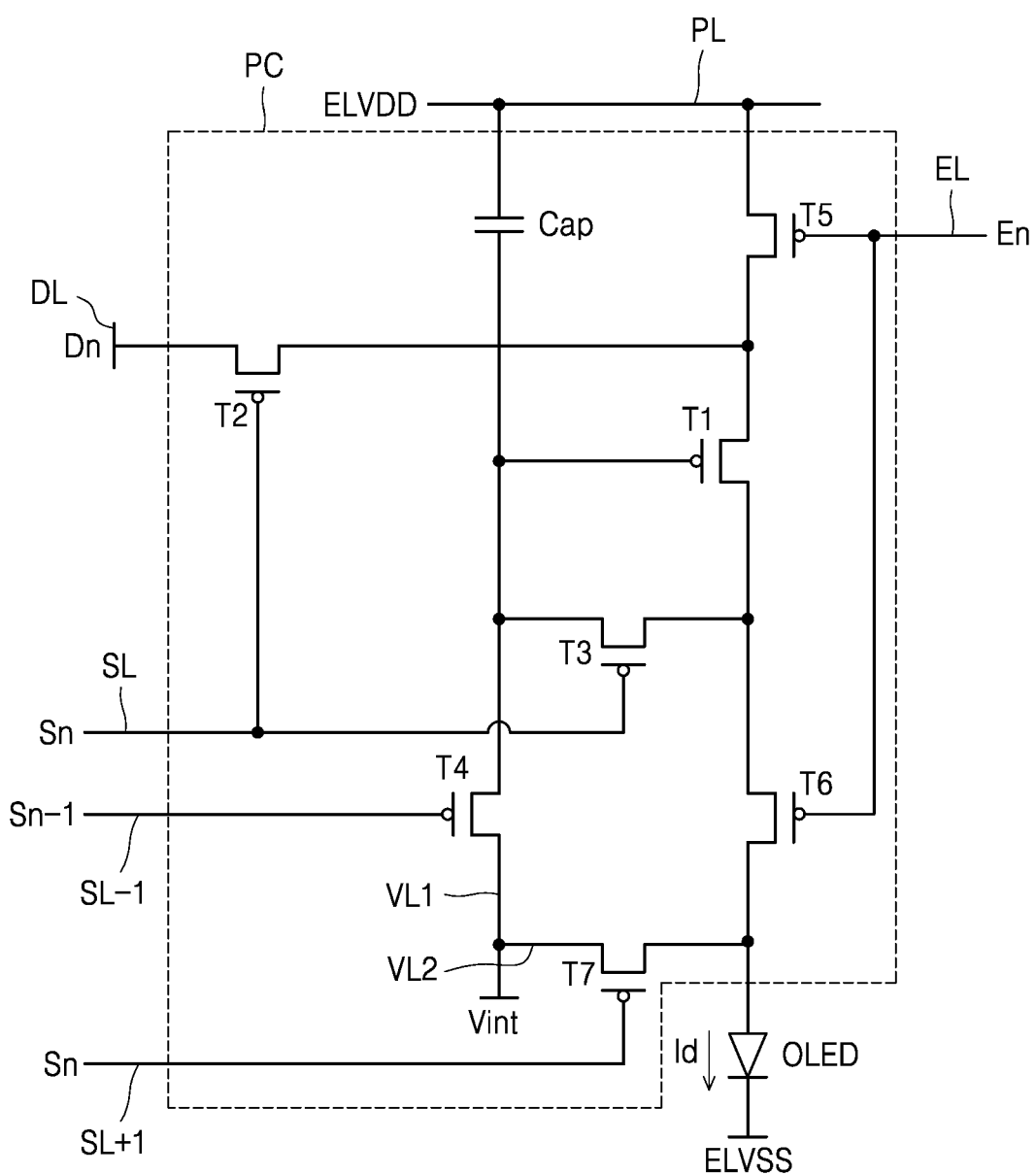
FIG. 3 is an equivalent circuit diagram of a pixel circuit of a display device according to an exemplary embodiment of the inventive concept.

FIG. 3 is an equivalent circuit diagram of a pixel circuit PC of a display device according to an exemplary embodiment of the inventive concept.

Referring to FIG. 3, the display panel 10 includes the pixel circuit PC including a plurality of thin film transistors T1, T2, T3, T4, T5, T6, and T7 and a storage capacitor Cap. In addition, the display panel 10 may include an organic light-emitting diode OLED as an emission element, the organic light-emitting diode OLED emitting light by receiving a driving voltage from the pixel circuit PC.

The pixel circuit PC may include a plurality of thin film transistors and a storage capacitor. In an exemplary embodiment of the inventive concept, as shown in FIG. 3, the thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

A gate electrode of the driving thin film transistor T1 is connected to an electrode of the storage capacitor Cap, one of a source electrode and a drain electrode of the driving thin film transistor T1 is connected to a driving voltage line PL through the operation control thin film transistor T5, and the other of the source electrode and the drain electrode of the driving thin film transistor T1 is electrically connected to a pixel electrode of the organic light-emitting diode OLED through the emission control thin film transistor T6. The driving thin film transistor T1 is configured to receive a data signal Dn depending on a switching operation of the switching thin film transistor T2 and supply a driving current Id to the organic light-emitting diode OLED.

A gate electrode of the switching thin film transistor T2 is connected to a first scan line SL, one of a source electrode and a drain electrode of the switching thin film transistor T2 is connected to a data line DL, and the other of the source electrode and the drain electrode of the switching thin film transistor T2 is connected to the driving thin film transistor T1 and the driving voltage line PL through the operation control thin film transistor T5. The switching thin film transistor T2 is turned on in response to a scan signal Sn transferred through the first scan line SL and is configured to perform a switching operation for transferring a data signal Dn transferred through the data line DL to the driving thin film transistor T1.

A gate electrode of the compensation thin film transistor T3 is connected to the first scan line SL, one of a source electrode and a drain electrode of the compensation thin film transistor T3 is connected to the driving thin film transistor T1 and the pixel electrode of the organic light-emitting diode OLED through the emission control thin film transistor T6, and the other of the source electrode and the drain electrode of the compensation thin film transistor T3 is connected to the electrode of the storage capacitor Cap, the first initialization thin film transistor T4, and the driving thin film transistor T1. The compensation thin film transistor T3 is turned on in response to a scan signal Sn transferred through the first scan line SL and is configured to diode-connect the driving thin film transistor T1 by electrically connecting the gate electrode of the driving thin film transistor T1 to one (e.g., the drain electrode) of the source electrode and the drain electrode of the driving thin film transistor T1.

A gate electrode of the first initialization thin film transistor T4 is connected to a second scan line SL-1, one of a source electrode and a drain electrode of the first initialization thin film transistor T4 is connected to a first initialization voltage line VL1, and the other of the source electrode and the drain electrode of the first initialization thin film transistor T4 is connected to the electrode of the storage capacitor Cap, the compensation thin film transistor T3, and the driving thin film transistor T1. The first initialization thin film transistor T4 is turned on in response to a previous scan signal Sn-1 transferred through the second scan line SL-1 and is configured to perform an initialization operation for initializing a voltage of the gate electrode of the driving thin film transistor T1 by transferring an initialization voltage Vint to the gate electrode of the driving thin film transistor T1.

A gate electrode of the operation control thin film transistor T5 is connected to an emission control line EL, one of a source electrode and a drain electrode of the operation control thin film transistor T5 is connected to the driving voltage line PL, and the other of the source electrode and the drain electrode of the operation control thin film transistor T5 is connected to the driving thin film transistor T1 and the switching thin film transistor T2.

A gate electrode of the emission control thin film transistor T6 is connected to the emission control line EL, one of a source electrode and a drain electrode of the emission control thin film transistor T6 is connected to the driving thin film transistor T1 and one of the source electrode and the drain electrode of the compensation thin film transistor T3, and the other of the source electrode and the drain electrode of the emission control thin film transistor T6 is electrically connected to the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow a driving voltage ELVDD to be transferred to the organic light-emitting diode OLED and thus the driving current Id to flow through the organic light-emitting diode OLED.

A gate electrode of the second initialization thin film transistor T7 may be connected to a third scan line SL+1. One of a source electrode and a drain electrode of the second initialization thin film transistor T7 is connected to the emission control thin film transistor T6 and the pixel electrode of the organic light-emitting diode OLED, and the other of the source electrode and the drain electrode of the second initialization thin film transistor T7 is connected to a second initialization voltage line VL2.

The first scan line SL may be electrically connected to the third scan line SL+1 and thus the same scan signal Sn may be applied to the third scan line SL+1. Therefore, the second initialization thin film transistor T7 may be turned on in response to a scan signal Sn transferred through the third scan line SL+1 and may perform an operation of initializing the pixel electrode of the organic light-emitting diode OLED.

In another example, the first initialization thin film transistor T4 and the second initialization thin film transistor T7 may be simultaneously connected to the second scan line SL-1.

One electrode of the storage capacitor Cap is connected to the driving voltage line PL, and an opposite electrode of the organic light-emitting diode OLED is connected to a common voltage ELVSS. Therefore, the organic light-emitting diode OLED may display an image by receiving the driving current Id from the driving thin film transistor T1 and emitting light.

Though it is shown in FIG. 3 that the pixel circuit PC includes seven thin film transistors T1, T2, T3, T4, T5, T6, and T7 and one storage capacitor Cap, the inventive concept is not limited thereto. The number of thin film transistors and the number of storage capacitors may be variously modified depending on the design of the pixel circuit PC.

Figure 4A:
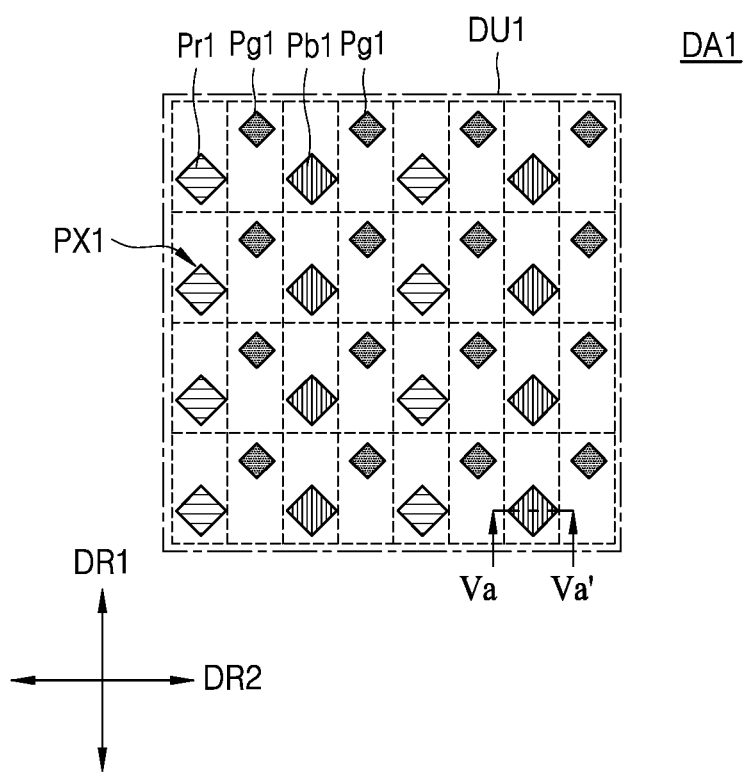
FIGS. 4A and 4B are plan views of a pixel arrangement of a display device according to an exemplary embodiment of the inventive concept.
Figure 4B:
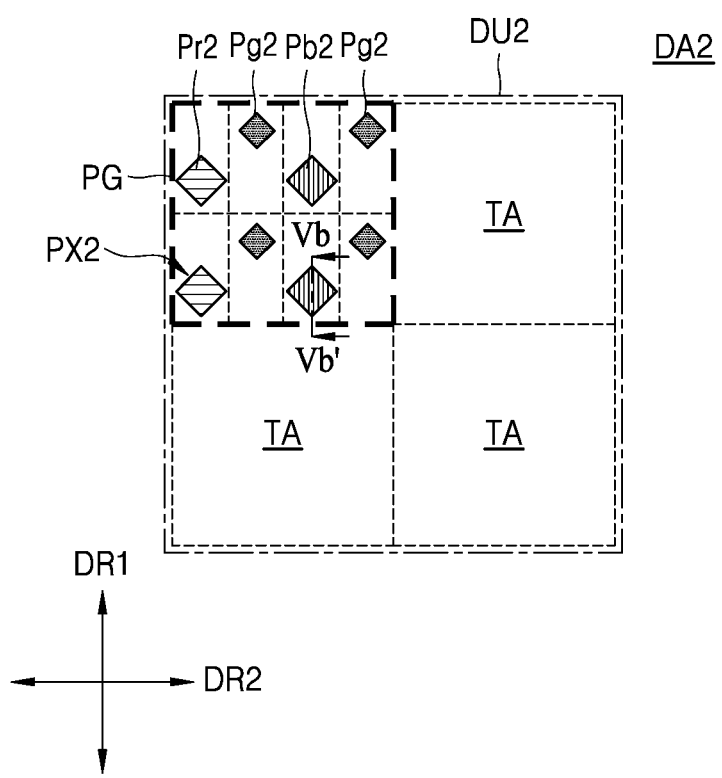

FIGS. 4A and 4B are plan views of a pixel arrangement according to an exemplary embodiment of the inventive concept.

Referring to FIG. 4A, the first pixels PX1 are arranged in the first display area DA1. The first pixels PX1 may include a first red pixel Pr1, a first green pixel Pg1, and a first blue pixel Pb1. A structure of each of the first red pixel Pr1, the first green pixel Pg1, and the first blue pixel Pb1 may correspond to a cross-sectional structure of the first pixel PX1 described below with reference to FIG. 5.

An array of the first pixels PX1 arranged in the first display area DA1 may include an arrangement structure of first display units DU1. The first display unit DU1 corresponds to a repetition unit of the first pixels PX1 arranged in the first display area DA1. The first display units DU1 may be arranged two-dimensionally in a first direction DR1 and a second direction DR2 intersecting the first direction DR1 in the first display area DA1 to constitute the array of the first pixels PX1. Though it is shown in FIG. 4A that the first display unit DU1 includes 32 first pixels PX1, the inventive concept is not limited thereto.

Though it is shown in FIG. 4A that the first red pixel Pr1, the first green pixel Pg1, and the first blue pixel Pb1 are arranged in a pentile type, the first red pixel Pr1, the first green pixel Pg1, and the first blue pixel Pb1 may be arranged in various configurations such as a stripe type.

Referring to FIG. 4B, the second pixels PX2 are arranged in the second display area DA2. The second pixels PX2 may include a second red pixel Pr2, a second green pixel Pg2, and a second blue pixel Pb2. A structure of each of the second red pixel Pr2, the second green pixel Pg2, and the second blue pixel Pb2 may correspond to a cross-sectional structure of the second pixel PX2 described below with reference to FIG. 5.

An array of the second pixels PX2 arranged in the second display area DA2 may include an arrangement structure of second display units DU2. The second display unit DU2 corresponds to a repetition unit of the second pixels PX2 arranged in the second display area DA2. The second display units DU2 may be arranged two-dimensionally in the first direction DR1 and the second direction DR2 intersecting the first direction DR1 in the second display area DA2 to constitute the array of the second pixels PX2.

In this case, the transmission area TA may be located between the plurality of second pixels PX2. For example, the transmission area TA may be arranged between pixel groups PG including the second pixels PX2. The pixel group PG may be a pixel set in which a plurality of second pixels PX2 are grouped in a predetermined unit. In other words, the second display unit DU2 may include the transmission area TA and pixel groups PG, wherein pixels are not arranged in the transmission area TA, and the pixel groups PG are apart from each other with the transmission area TA therebetween. Though it is shown in FIG. 4B that the pixel group PG includes eight second pixels PX2, the inventive concept is not limited thereto. The number of second pixels PX2 included in the pixel group PG may be modified depending on the resolution of the second display area DA2.

Though it is shown in FIG. 4B that the second display unit DU2 includes one pixel group PG and three transmission areas TA arranged in an L-shape around the pixel group PG, the second display unit DU2 may be configured such that transmission areas TA entirely surround a plurality of pixel groups PG that neighbor each other. In addition, the second display units DU2 may be configured such that a plurality of transmission areas TA and a plurality of pixel groups PG are alternately arranged in a lattice configuration.

Though it is shown in FIG. 4B that the second red pixel Pr2, the second green pixel Pg2, and the second blue pixel Pb2 are arranged in a pentile type, the second red pixel Pr2, the second green pixel Pg2, and the second blue pixel Pb2 may be arranged in various configurations such as a stripe type.

The second pixels PX2 may not be arranged in the transmission area TA. When the second pixels PX2 are not arranged in the transmission area TA, an organic light-emitting diode and a pixel circuit of the second pixel PX2 may also not be arranged in the transmission area TA. In addition, signal lines PL, EL, VL1, VL2, DL, SL, SL-1, and SL+1 (see FIG. 3) connected to supply a signal to a second pixel PX2 may not be arranged in the transmission area TA.

Referring to FIGS. 4A and 4B, the number of first pixels PX1 in the first display area DA1 may be greater than the number of second pixels PX2 in the second display area DA2 per the same area. For example, the number of first pixels PX1 per display unit in the first display area DA1 may be greater than the number of second pixels PX2 per display unit in the second display area DA2. The display unit of the first display area DA1 and the display unit of the second display area DA2 may have the same area.

Figure 5:
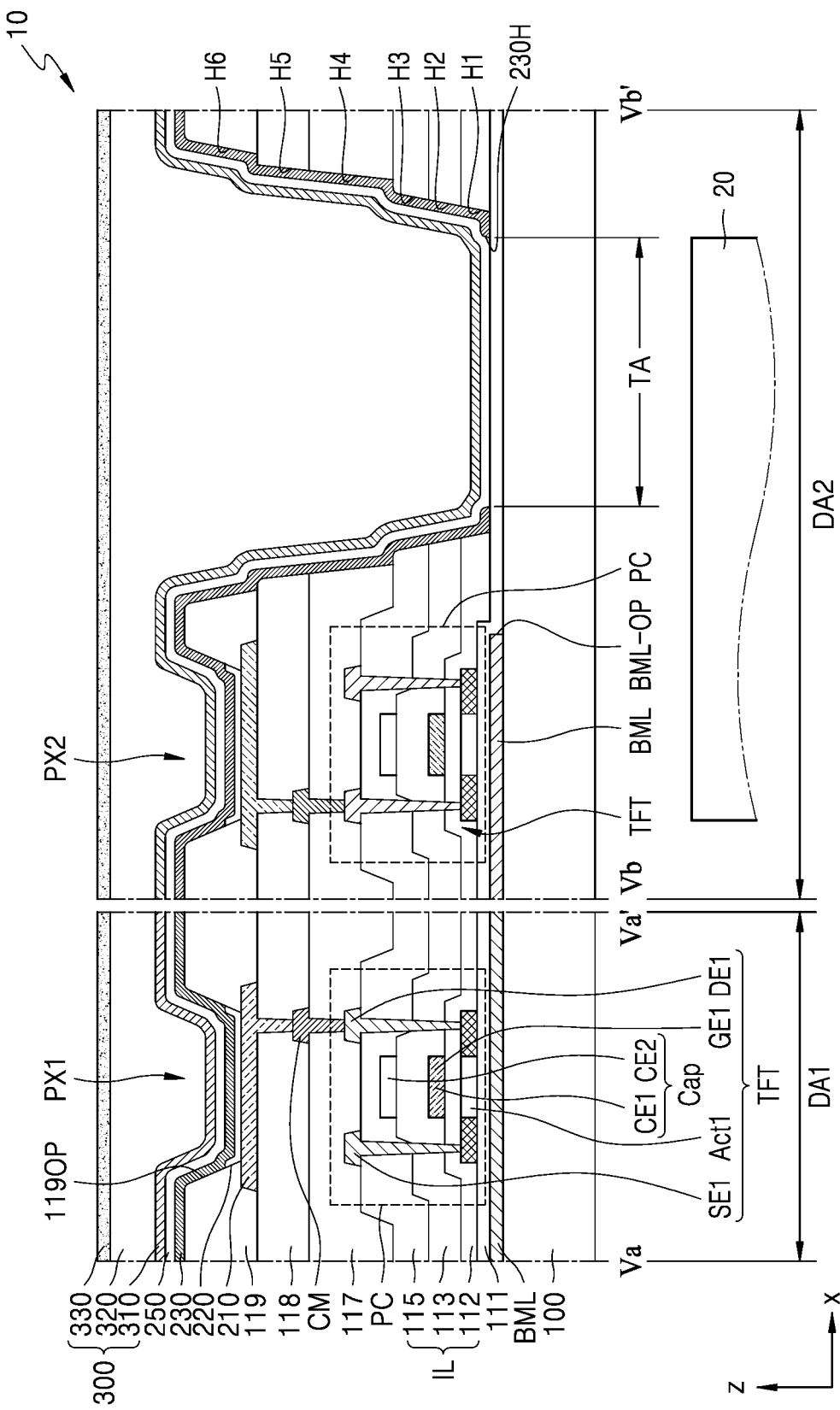
FIG. 5 is a cross-sectional view of a display device along lines Va-Va' of FIG. 4A and Vb-Vb' of FIG. 48.

FIG. 5 is a cross-sectional view of a display device taken along lines Va-Va' of FIG. 4A and Vb-Vb' of FIG. 4B.

First, referring to the first display area DA1 in the cross-section of a display device taken along line Va-Va' of FIG. 5, the substrate 100 may include a transparent insulating substrate including materials such as glass and quartz and have a single-layered structure. In another exemplary embodiment of the inventive concept, the substrate 100 may have a multi-layered structure including a base layer and an inorganic layer, the base layer including a polymer resin.

The buffer layer 111 may be arranged over the substrate 100. The buffer layer 111 may reduce or block the penetration of foreign substances, moisture, or external air from below the substrate 100 and provide a flat surface on the substrate 100. The buffer layer 111 may include an inorganic insulating material such as silicon oxide, silicon oxynitride, and silicon nitride and have a single layered or multi-layered structure including the above materials.

The pixel circuit PC may be arranged on the buffer layer 111, the pixel circuit PC including the thin film transistor TFT and the storage capacitor Cap. The pixel circuits PC may be respectively arranged in the first display area DA1 and the second display area DA2. The pixel circuit PC in the first display area DA1 and the pixel circuit PC in the second display area DA2 may have the same structure.

The light-blocking layer BML may be arranged between the pixel circuit PC arranged in the second display area DA2 and the substrate 100. Though it is shown in FIG. 5 that the light-blocking layer BML is arranged between the substrate 100 and the buffer layer 111, the light-blocking layer BML may be arranged between the plurality of sub-layers constituting the substrate 100. The light-blocking layer BML may include a light-blocking material (e.g., a metal, black ink, or dye, etc.).

The light-blocking layer BML may prevent light that is emitted from the electronic component 20 or directed to the electronic component 20 from being diffracted through a narrow slit between wirings connected to the pixel circuit PC (see FIG. 3) and prevent light that is emitted from the electronic component 20 from being incident to the pixel circuit PC. This way, the performance of the thin film transistor TFT may be improved.

The thin film transistor TFT may include a semiconductor layer Act1, a gate electrode GE1, a source electrode SE1, and a drain electrode DE1, the gate electrode GE1 overlapping a channel region of the semiconductor layer Act1, the source electrode SE1 and the drain electrode DE1 being respectively connected to a source region and a drain region of the semiconductor layer Act1. A gate insulating layer 112 is arranged between the semiconductor layer Act1 and the gate electrode GE1. A first interlayer insulating layer 113 and a second interlayer insulating layer 115 may be arranged between the gate electrode GE1 and the source electrode SE1 or between the gate electrode GE1 and the drain electrode DE1.

The storage capacitor Cap may overlap the thin film transistor TFT. The storage capacitor Cap may include a first capacitor plate CE1 and a second capacitor plate CE2 overlapping each other. In an exemplary embodiment of the inventive concept, the gate electrode GE1 of the thin film transistor TFT may include the first capacitor plate CE1 of the storage capacitor Cap. The first interlayer insulating layer 113 may be arranged between the first capacitor plate CE1 and the second capacitor plate CE2.

The semiconductor layer Act1 may include polycrystalline silicon. In an exemplary embodiment of the inventive concept, the semiconductor layer Act1 may include amorphous silicon. In an exemplary embodiment of the inventive concept, the semiconductor layer Act1 may include an oxide of at least one of indium (in), gallium (Ga), stannum (Sn), zirconium (Zr), vanadium (V), hafnium (Hf), cadmium (Cd), germanium (Ge), chrome (Cr), titanium (Ti), and zinc (Zn). The semiconductor layer Act1 may include the channel region, the source region, and the drain region, the source region and the drain region being doped with impurities.

The gate insulating layer 112 may include an inorganic insulating material such as silicon oxide, silicon oxynitride, and silicon nitride and have a single layered or multi-layered structure including the above materials.

The gate electrode GE1 or the first capacitor plate CE1 may include a low-resistance conductive material including molybdenum (Mo), aluminum (Al), copper (Cu), and/or titanium (Ti) and have a single layered or multi-layered structure including the above materials.

The first interlayer insulating layer 113 may include an inorganic insulating material such as silicon oxide, silicon oxynitride, and silicon nitride and have a single layered or multi-layered structure including the above materials.

The second capacitor plate CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single layered or multi-layered structure including the above materials.

The second interlayer insulating layer 115 may include an inorganic insulating material such as silicon oxide, silicon oxynitride, and silicon nitride and have a single layered or multi-layered structure including the above materials.

The source electrode SE1 or the drain electrode DE1 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single layered or multi-layered structure including the above materials. For example, the source electrode SE1 or the drain electrode DE1 may have a three-layered structure of a titanium layer/aluminum layer/titanium layer.

The pixel circuit PC may be electrically connected to a pixel electrode 210, the pixel circuit PC including the thin film transistor TFT and the storage capacitor Cap. In an exemplary embodiment of the inventive concept, as shown in FIG. 5, the pixel circuit PC may be electrically connected to the pixel electrode 210 by a contact metal CM.

The contact metal CM may be arranged on a first planarization insulating layer 117 and connected to the pixel circuit PC through a contact hole formed in the first planarization insulating layer 117. The contact metal CM may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single layered or multi-layered structure including the above materials.

The first planarization insulating layer 117 may include an organic insulating material. The first planarization insulating layer 117 may include an organic insulating material such as acryl, benzocyclobutene (BCB), polyimide, and hexamethyldisiloxane (HMDSO). The organic insulating material of the first planarization insulating layer 117 may include a photosensitive organic insulating material.

A second planarization insulating layer 118 is arranged on the contact metal CM. The second planarization insulating layer 118 may include an organic insulating material. The second planarization insulating layer 118 may include an organic insulating material such as acryl, benzocyclobutene (BCB), polyimide, and hexamethyldisiloxane (HMDSO). The organic insulating material of the second planarization insulating layer 118 may include a photosensitive organic insulating material.

The pixel electrode 210 may be arranged on the second planarization insulating layer 118. The pixel electrode 210 may be connected to the contact metal CM through a contact hole of the second planarization insulating layer 118.

The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The pixel electrode 210 may include the reflective layer including the above material and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide (IGO), and aluminum zinc oxide (AZO). In an exemplary embodiment of the inventive concept, the pixel electrode 210 may have a three-layered structure of ITO layer/Ag layer/ITO layer that are sequentially stacked.

A pixel-defining layer 119 may be arranged on the pixel electrode 210. The pixel-defining layer 119 may cover edges of the pixel electrode 210 and include an opening 1190P overlapping a central portion of the pixel electrode 210.

The pixel-defining layer 119 may prevent an arc, etc. from occurring at the edges of the pixel electrode 210 by increasing a distance between the edges of the pixel electrode 210 and an opposite electrode 230 over the pixel electrode 210. The pixel-defining layer 119 may include an organic insulating material such as polyimide, polyamide, an acrylic resin, BCB, HMDSO, and a phenolic resin. The pixel-defining layer 119 may be formed by a method such as spin coating.

An intermediate layer 220 is arranged on the pixel-defining layer 119 to correspond to the pixel electrode 210. The intermediate layer 220 may include a polymer organic material or a low molecular weight organic material emitting light having a predetermined color.

The opposite electrode 230 is arranged on the intermediate layer 220. The opposite electrode 230 may include a conductive material having a relatively low work function. For example, the opposite electrode 230 may include a (semi)-transparent layer including silver (Ag), magnesium (Mg), aluminum (Al), nickel (Ni), chrome (Cr), lithium (Li), calcium (Ca), or an alloy thereof. Alternatively, the opposite electrode 230 may further include a layer including ITO, IZO, ZnO, or $In_2O_3$ on/under the (semi)-transparent layer including the above materials. In an exemplary embodiment of the inventive concept, the opposite electrode 230 may include Ag and Mg. The opposite electrode 230 may include one body to entirely cover the first and second display areas DA1 and DA2 (see FIG. 1).

A stacked structure of the pixel electrode 210, the intermediate layer 220, and the opposite electrode 230 that are sequentially stacked may constitute a light-emitting diode, for example, an organic light-emitting diode OLED. The organic light-emitting diode OLED may emit red, green, or blue light. An emission area of each organic light-emitting diode OLED corresponds to a pixel. For example, the first pixel PX1 corresponds to an emission area of an organic light-emitting diode OLED arranged in the first display area DA1, and the second pixel PX2 corresponds to an emission area of an organic light-emitting diode OLED arranged in the second display area DA2. Since the opening 1190P of the pixel-defining layer 119 defines a size and/or a width of an emission area, a size and/or a width of the first pixel PX1 and the second pixel PX2 may depend on the opening 1190P of the pixel-defining layer 119.

A capping layer 250 may be formed on the opposite electrode 230. The capping layer 250 may include lithium fluoride (LiF). Alternatively, the capping layer 250 may include an inorganic insulating material such as silicon nitride and/or include an organic insulating material. In an exemplary embodiment of the inventive concept, the capping layer 250 may be omitted.

The thin-film encapsulation layer 300 may be arranged on the capping layer 250. The organic light-emitting diode OLED may be covered by the thin-film encapsulation layer 300. The thin-film encapsulation layer 300 may include the first and second inorganic encapsulation layers 310 and 330 and the organic encapsulation layer 320 therebetween.

Each of the first and second inorganic encapsulation layers 310 and 330 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by chemical vapor deposition.

The organic encapsulation layer 320 may include a polymer-based material. The polymer-based material may include an acryl-based resin, an epoxy-based resin, polyimide, and polyethylene. For example, the organic encapsulation layer 320 may include an acryl-based resin, for example, polymethyl methacrylate, a polyacrylic acid, etc. The organic encapsulation layer 320 may be formed by hardening a monomer or coating a polymer.

Referring to the second display area DA2 in the cross-section of a display device taken along line Vb-Vb' of FIG. 5, the transmission area TA is arranged, and each of insulating layers on the substrate 100 may include a hole formed in the transmission area TA. For example, the gate insulating layer 112, the first interlayer insulating layer 113, the second interlayer insulating layer 115, the first planarization insulating layer 117, the second planarization insulating layer 118, and the pixel-defining layer 119 each may be located in the transmission area TA and may respectively include first to sixth holes H1, H2, H3, H4, H5, and H6 that overlap one another. In addition, the opposite electrode 230 may include a hole 230H in the transmission area TA. There is no light-blocking layer BML in the transmission area TA. For example, the light-blocking layer BML may include an opening BML-OP corresponding to the transmission area TA. In addition, the light-blocking layer BML may extend to an edge of the pixel circuit PC and then be absent from a space between the edge of the pixel circuit PC and the transmission area TA. This way, a light transmittance of the transmission area TA may be improved.

Figure 6A:
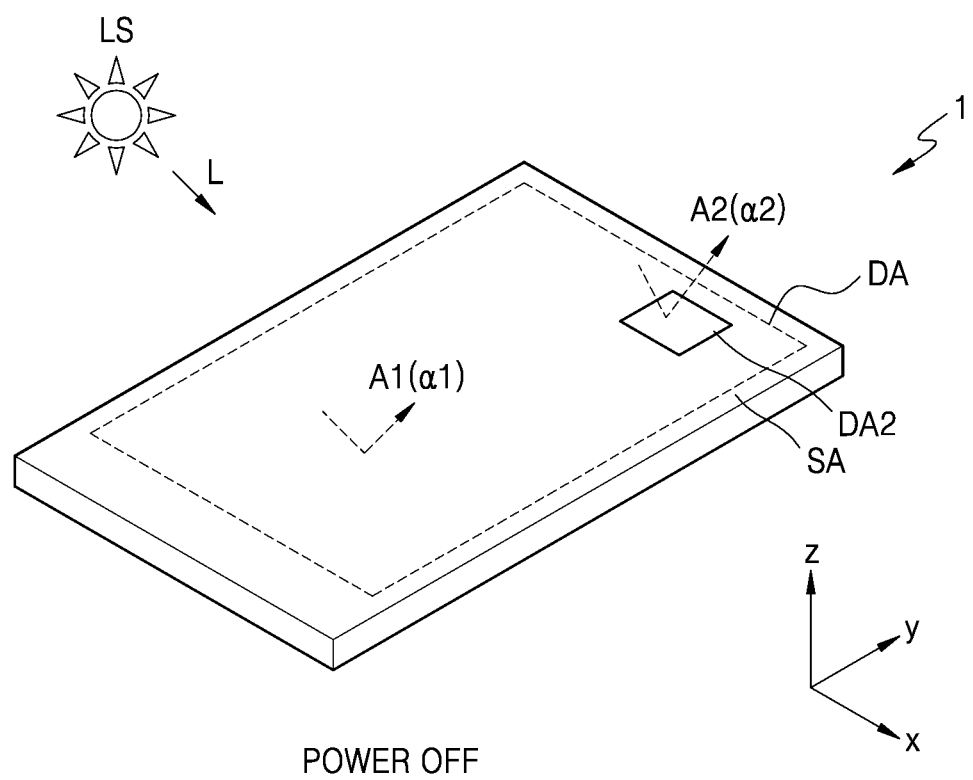
FIGS. 6A and 6B are perspective views of a display device in power-on/off states according to an exemplary embodiment of the inventive concept.
Figure 6B:
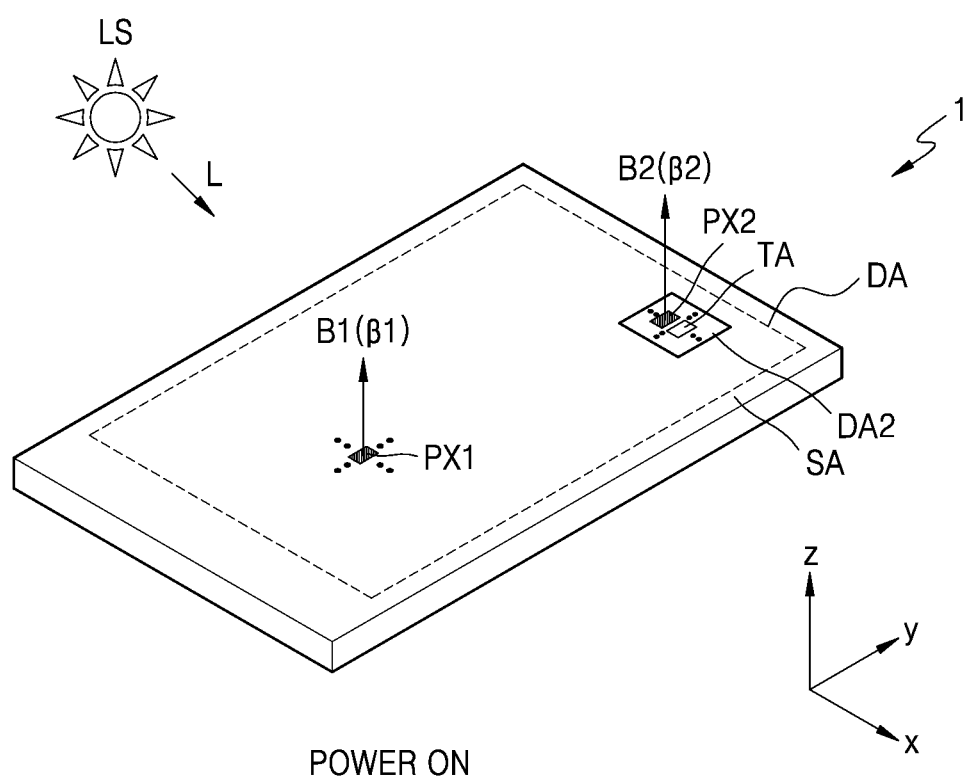

FIGS. 6A and 6B are perspective views of the display device 1 in power-on/off states according to an exemplary embodiment of the inventive concept.

Referring to FIG. 6A, the display device 1 according to an exemplary embodiment of the inventive concept may be used when there is external light L. The external light L may be light generated from a light source LS other than the organic light-emitting diode OLED, which is a display element provided inside the display device 1. The external light L may include light generated from the light source LS located outside the display device 1, the light source LS including, for example, sunlight, incandescent light, and fluorescent light. An external light characteristic may be changed depending on a type of the light source LS. Here, the external light characteristic may include an external light spectrum λ, which is a luminance value depending on the wavelength of the external light L, and illuminance of the external light L.

In the case where a user uses the display device 1, light entering eyes of the user may include a portion of the external light L reflected from the display device 1 and light emitted from the pixels PX of the display device 1.

First, referring to the display device 1 in a power-off state of FIG. 6A, the external light L reaching to the display device 1 may be reflected from one side of the display device 1. A first-reflected light A1 reflected from the first display area DA1 among the external light L may have a first external light reflection characteristic, and a second-reflected light A2 reflected from the second display area DA2 among the external light L may have a second external light reflection characteristic. The first external light reflection characteristic may include a first-reflected spectrum α1, which is a reflectivity depending on the wavelength of the external light L in the first display area DA1, and the second external light reflection characteristic may include a second-reflected spectrum α2, which is a reflectivity depending on the wavelength of the external light L in the second display area DA2. As described hereinafter with reference to FIG. 7, the first external light reflection characteristic and the second external light reflection characteristic may be different due to structural differences such as pixel structures and arrangements in the first display area DA1 and the second display area DA2.

Referring to the display device 1 in a power-on state of FIG. 6B, light B1 emitted from the first pixels PX1 in the first display area DA1 of the display device 1 may have a first emission characteristic, and light B2 emitted from the second pixels PX2 in the second display area DA2 of the display device 1 may have a second emission characteristic. The first emission characteristic may include a first emission spectrum β1, which is a luminance value depending on the wavelength of the light B1 emitted from the first pixels PX1, and the second emission characteristic may include a second emission spectrum β2, which is a luminance value depending on the wavelength of the light B2 emitted from the second pixels PX2. The first emission characteristic may be different from the second emission characteristic.

In the case where a user uses the display device 1 when there is external light L, light that may be observed by the user when the user views the first display area DA1 may have a first observation light characteristic including a combination of an external light characteristic, a first external light reflection characteristic, and a first emission characteristic. In addition, light that may be observed by the user when the user views the second display area DA2 may have a second observation light characteristic including a combination of an external light characteristic, a second external light reflection characteristic, and a second emission characteristic. The first observation light characteristic and the second observation light characteristic may respectively include a first observation spectrum and a second observation spectrum.

As described hereinafter with reference to FIG. 7, due to a structural difference between the first display area DA1 and the second display area DA2, the first external light reflection characteristic may be different from the second external light reflection characteristic, and the first emission characteristic may be different from the second emission characteristic. Therefore, the first observation light characteristic may be different from the second observation light characteristic, and thus, a user may feel an image quality heterogeneity (e.g., a disparity) that may occur between the first display area DA1 and the second display area DA2. This may deteriorate display quality of the display device.

Figure 7:
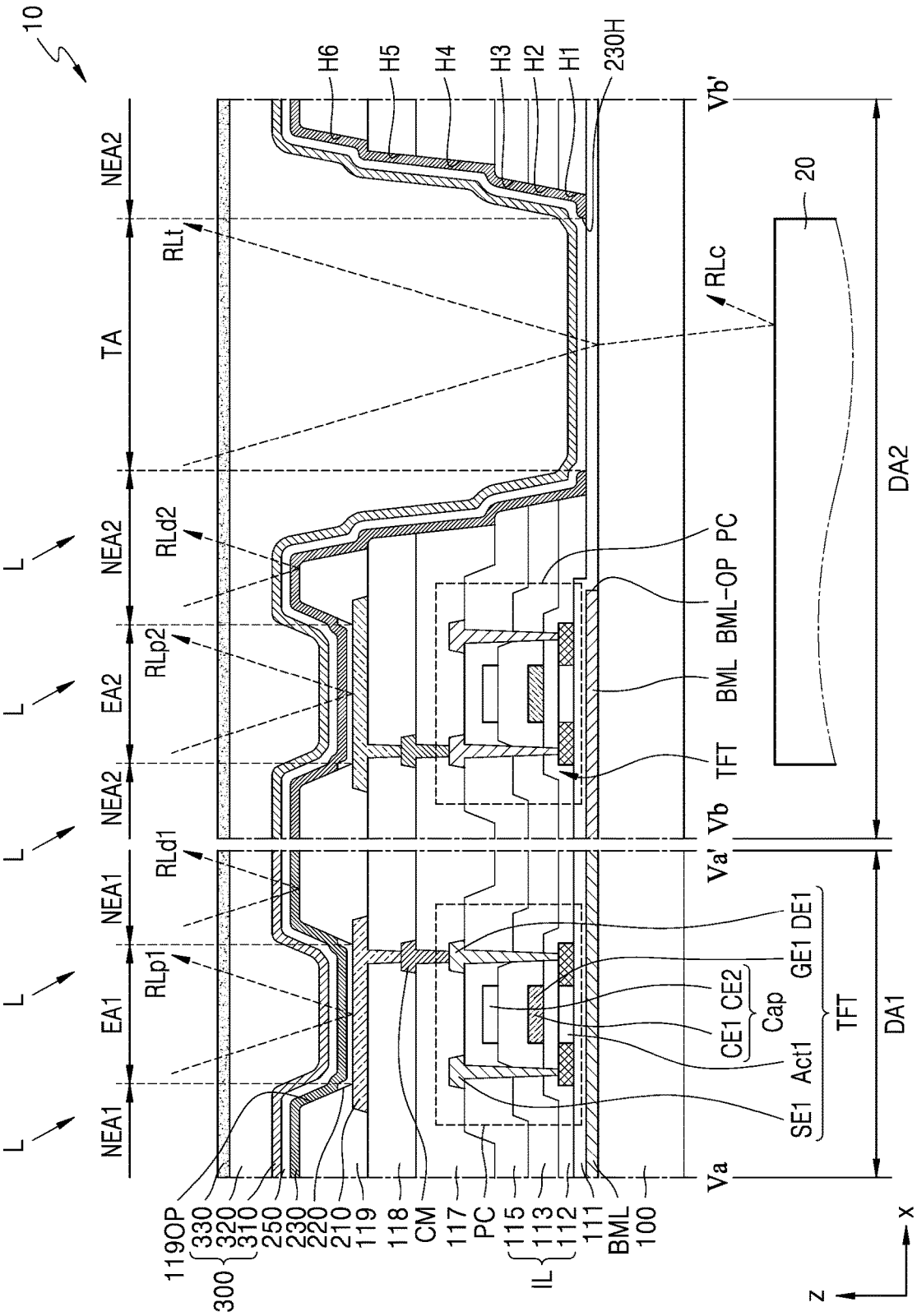
FIG. 7 is a cross-sectional view of a display device along lines Va-Va' of FIG. 4A and Vb-Vb' of FIG. 4B, showing a reflection characteristic and a transmission characteristic of external light in a display device according to an exemplary embodiment of the inventive concept.

FIG. 7 is a cross-sectional view of a display device taken along lines Va-Va' of FIG. 4A and Vb-Vb' of FIG. 4B, showing a reflection characteristic and a transmission characteristic of external light in a display device according to an exemplary embodiment of the inventive concept.

Since the stacked structure of the display panel 10 of FIG. 7 is described above with reference to FIG. 5, a repeated description thereof is omitted.

First, referring to the first display area DA1 of FIG. 7, the first display area DA1 may include first emission areas EA1 and first non-emission areas NEA1, the first emission areas EA being regions in which an organic light-emitting diode OLED, which is a display element, emits light, and the first non-emission areas NEA1 being regions surrounding the first emission areas EA1.

The first emission areas EA1 may correspond to the first pixels PX1, and the first non-emission areas NEA1 may correspond to regions in which the pixel-defining layers 119 are located, the pixel-defining layers 119 including the opening 1190P that defines the first pixel PX1.

A portion of external light L incident to the first display area DA1 may be reflected from one surface of an organic light-emitting diode OLED in the first emission area EA1 and reflected from one surface of the pixel-defining layer 119 in the first non-emission area NEA1. In other words, the first-reflected light A1 (see FIG. 6A) may include reflected light RLp1 in the first emission area EA1 and reflected light RLd1 in the first non-emission area NEA1.

Referring to the second display area DA2 of FIG. 7, the second display area DA2 may include a second emission area EA2, a second non-emission area NEA2, and a transmission area TA, the second emission area EA2 being a region in which an organic light-emitting diode OLED, which is a display element, emits light, and the second non-emission area NEA2 being a region surrounding the second emission area EA2.

A portion of external light L incident to the second display area DA2 may be reflected from one surface of the organic light-emitting diode OLED in the second emission area EA2 and reflected from one surface of the pixel-defining layer 119 in the second non-emission area NEA2. In addition, a portion of external light L may be reflected from one surface of the substrate 100 in the transmission area TA, and a portion of light that passes through the substrate 100 without being reflected by the one surface of the substrate 100 may be reflected from one surface of the electronic component 20 located in the second display area DA2. The second-reflected light A2 (see FIG. 6A) may include reflected light RLp2 in the second emission area EA2, reflected light RLd2 in the second non-emission area NEA2, reflected light RLt in the transmission area TA, and reflected light RLc in the area of the electronic component 20.

Therefore, due to different pixel structures and arrangements in the first display area DA1 and the second display area DA2, reflection characteristics in the two areas may be different from each other, and consequently, the first observation light characteristic may be different from the second observation light characteristic. This may cause an image quality heterogeneity between the two areas and thus the display quality of the display panel 10 may be deteriorated.

Figure 8:
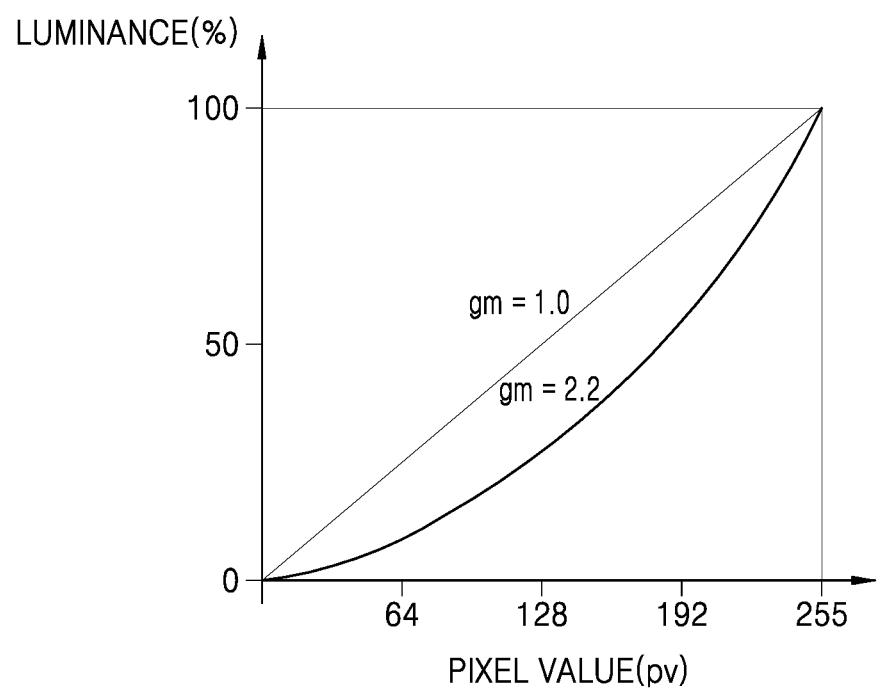
FIG. 8 is a graph of a relationship between luminance and a pixel value depending on a gamma value of a pixel in a display device according to an exemplary embodiment of the inventive concept.

FIG. 8 is a graph of a relation between a luminance and a pixel value depending on a gamma value of a pixel in the display device 1 according to an exemplary embodiment of the inventive concept. In the graph of FIG. 8, an x-axis represents a pixel value pv that is input, and a y-axis represents a luminance of an organic light-emitting diode OLED.

The luminance of the organic light-emitting diode OLED may be determined by the intensity of the driving current Id (see FIG. 3). The intensity of the driving current Id may be determined by a data signal Dn (see FIG. 3). A data signal Dn is supplied by a data driver. The data driver outputs a data signal Dn corresponding to image data DATA received from a controller. The image data DATA is data corresponding to an input signal received by the controller and may include a pixel value pv. In other words, the pixel value pv may correspond to the luminance of the organic light-emitting diode OLED.

The pixel value pv is a data value having an 8 bit-size and may designate each luminance for each level ranging from 0 to 255. The pixel value pv may include a gray scale.

Referring to FIG. 8, a relation between a pixel value pv and a luminance may change depending on a gamma value gm. The gamma value gm is a numerical value representing a response characteristic of a pixel value pv in an image with respect to an input. In the case where a gamma value gm is 1.0, a luminance that is output is directly proportional to a pixel value pv that is input. In the case where a gamma value gm is 2.2, a luminance that is output may change a lot when a pixel value that is input is large.

The luminance of the pixels PX in the first display area DA1 and the second display area DA2 may be controlled by correcting a pixel value pv that is output from the controller and a gamma value that is set. This way, an image quality heterogeneity may be prevented or minimized by removing or reducing a difference in color between the two areas. Hereinafter, a method of controlling the luminance of each pixel PX by specifically using a pixel value pv and a gamma value gm is described.

Figure 9:
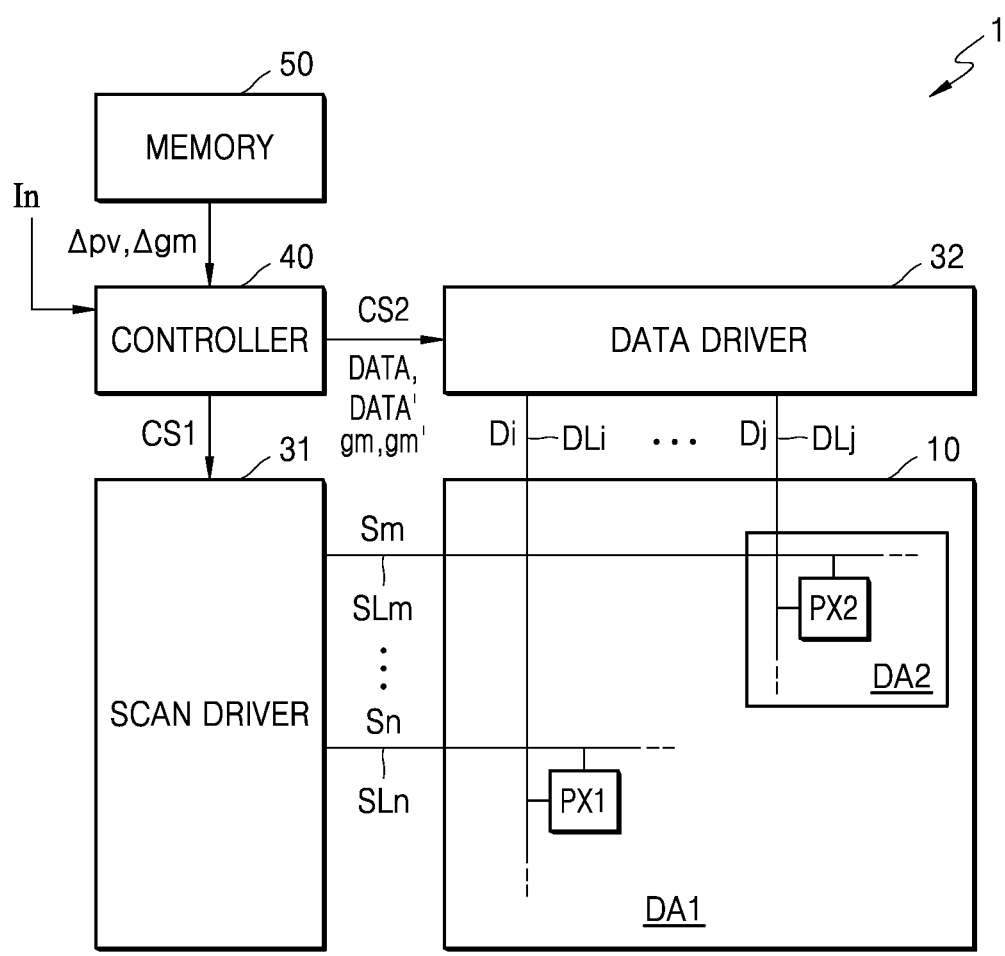
FIG. 9 is a block diagram of a structure of a display device according to an exemplary embodiment of the inventive concept.

FIG. 9 is a block diagram of a structure of the display device 1 according to an exemplary embodiment of the inventive concept.

Referring to FIG. 9, the display panel 10 may include a plurality of first pixels PX1, a plurality of second pixels PX2, a scan driver 31, a data driver 32, a controller 40, and a memory 50, the plurality of first pixels PX1 and the plurality of second pixels PX2 being respectively arranged in the first display area DA1 and the second display area DA2, and the scan driver 31, the data driver 32, the controller 40, and the memory 50 being arranged in the surrounding area SA.

The display panel 10 may include the substrate 100 (see FIG. 2). The substrate 100 may include the display area DA and the surrounding area SA respectively corresponding to the display area DA (see FIG. 1) and the surrounding area SA (see FIG. 1) of the display panel 10. The display area DA may include the first display area DA1 and the second display area DA2. The first display area DA1 may include the first pixels PX1, and the second display area DA2 may include the second pixels PX2 and the transmission areas.

In an exemplary embodiment of the inventive concept, the scan driver 31, the data driver 32, the controller 40, and the memory 50 may be arranged in the surrounding area SA of the substrate 100. In another exemplary embodiment of the inventive concept, the scan driver 31 may be arranged on the substrate 100, and the data driver 32, the controller 40, and the memory 50 may be arranged on a flexible printed circuit board (FPCB) electrically connected to a pad arranged on one side of the substrate 100.

A plurality of scan lines SLm and SLn and a plurality of data lines DLi and DLj may be arranged in a matrix configuration in the display panel 10, the plurality of scan lines SLm and SLn being apart from each other with a constant interval in a row, and the plurality of data lines DLi and DLj being apart from each other with a constant interval in a column. The pixel PX (see FIG. 1) and the pixel circuit PC (see FIG. 3) may be arranged in an intersection area of the scan lines SLm and SLn and the data lines DLi and DLj.

The scan driver 31 may generate scan signals Sm and Sn and sequentially supply the scan signals Sm and Sn to the display area DA through the plurality of scan lines SLm and SLn. The data driver 32 may sequentially supply data signals Di and Dj to the display area DA through the plurality of data lines DLi and DLj. The data driver 32 may receive image data DATA including a pixel value pv and a gamma value gm from the controller 40 and convert the image data DATA and the gamma value into data signals Di and Dj of a voltage or a current form.

The controller 40 may receive an input signal In, generate a scan control signal CS1 and a data control signal CS2, and respectively transfer the scan control signal CS1 and the data control signal CS2 to the scan driver 31 and the data driver 32. Therefore, the scan driver 31 may sequentially apply scan signals Sm and Sn to the scan lines SLm and SLn, and the data driver 32 may apply data signals Di and Dj to each pixel. The input signal In may include not only a signal for input data supplied from an external system through an interface but also a signal for an external light characteristic such as external light spectrum and external light illuminance.

The controller 40 may be connected to the memory 50 storing correction values of a pixel value Δpv and correction values of a gamma value Δgm. A lookup table or a graph defining the correction values of the pixel value Δpv and the correction values of the gamma value Δgm depending on an external light characteristic are stored in the memory 50 in advance. The controller 40 may calculate or select corrected data DATA' that is obtained by correcting image data DATA to correct the luminance of at least one of the first pixels PX1 and the second pixels PX2 with reference to the lookup table or the graph. In other words, the corrected data DATA' is corrected image data that reflects the correction value of the pixel value Δpv.

The correction value of the pixel value Δpv and the correction value of the gamma value Δgm may respectively include a pixel value-related function value and a gamma value-related function value for external light illuminance of at least one of the first pixels PX1 and the second pixels PX2. The pixel value-related function value and the gamma value-related function value make a white color coordinate of the first display area DA1 equal to a white color coordinate of the second display area DA2 based on an external light characteristic, external light reflection characteristics of the first display area DA1 and the second display area DA2, and emission characteristics of the first display area DA1 and the second display area DA2. However, the inventive concept is not limited thereto and the white color coordinate of the first display area DA1 may be made equal to a white color coordinate of the second display area DA2 based on an external light characteristic and at least one of the external light reflection characteristic of the first display area DA1, the external light reflection characteristic of the second display area DA2, the emission characteristic of the first display area DA1 and the emission characteristic of the second display area DA2.

In an exemplary embodiment of the inventive concept, the correction values of the pixel value Δpv may be obtained based on a ratio of correction of luminance of the second pixels PX2 that make a white color coordinate of the second display area DA2 equal to a white color coordinate of the first display area DA1.

When the luminance of the second pixels PX2 is corrected, the luminance may be reduced or increased. In this case, a gamma value gm may be corrected together to prevent or minimize the deterioration of display quality. Therefore, correction values of a gamma value Δgm may include correction values of a gamma value Δgm of the second display area DA2 obtained based on a ratio of correction of luminance of the second pixels PX2.

The controller 40 may receive an input signal In including an external light spectrum and/or external light illuminance and load a correction value of a pixel value Δpv corresponding to the input value among the correction values of the pixel value Δpv stored in the memory 50. The controller 40 may calculate and select corrected data DATA' that is obtained by reflecting the correction value of the pixel value Δpv loaded from the memory 50 to image data DATA, and then output the corrected data DATA' to the data driver 32. This way, the controller 40 may control the data driver 32 to output data signals Di and Dj that reflect the correction value of the pixel value Δpv to the second pixels PX2.

In addition, the controller 40 may simultaneously load a correction value of a gamma value Δgm corresponding to an input value among the correction values of the gamma value Δgm stored in the memory 50. The controller 40 may output a corrected gamma value gm' to the data driver 32, the corrected gamma value gm' reflecting the correction value of the gamma value Δgm loaded from the memory 50 to a gamma value gm set in advance. This way, the controller 40 may control the data driver 32 to output data signals Di and Dj that reflect the corrected gamma value gm' to the second pixels PX2.

In this case, image data for the first pixels PX1 may be output from the controller 40 to the data driver 32 without correction.

In another exemplary embodiment of the inventive concept, the correction values of the pixel value Δpv may include correction values of a pixel value Δpv obtained based on a ratio of correction of luminance of the first pixels PX1 and correction values of a pixel value Δpv obtained based on a ratio of correction of luminance of the second pixels PX2. The correction values of the pixel value Δpv make a white color coordinate of the first display area DA1 and a white color coordinate of the second display area DA2 equal to a reference white color coordinate. Here, the reference white color coordinate is a third white color coordinate different from a white color coordinate of the first display area DA1 and a white color coordinate of the second display area DA2, and may be a value set in advance.

In this case, the correction values of the gamma value Δgm may include the correction values of the gamma value Δgm of the first display area DA1 obtained based on a ratio of correction of luminance of the first pixels PX1 and the correction values of the gamma value Δgm of the second display area DA2 obtained based on a ratio of correction of luminance of the second pixels PX2.

The controller 40 may receive an input signal In including an external light spectrum and/or external light illuminance and load a correction value of a pixel value Δpv corresponding to the input value among correction values of a pixel value Δpv stored in the memory 50. The controller 40 may calculate and select corrected data DATA' that is obtained by reflecting the correction value of the pixel value Δpv loaded from the memory 50 to image data DATA, and then output the corrected data DATA' to the data driver 32. This way, the controller 40 may control the data driver 32 to output data signals Di and Dj that reflect the correction value of the pixel value Δpv to the first pixels PX1 and the second pixels PX2.

In addition, the controller 40 may simultaneously load a correction value of a gamma value Δgm corresponding to an input value among correction values of a gamma value Δgm stored in the memory 50. The controller 40 may output a corrected gamma value gm' to the data driver 32, the corrected gamma value gm' being obtained by reflecting the correction value of the gamma value Δgm loaded from the memory 50 to a gamma value gm set in advance. This way, the controller 40 may control the data driver 32 to output data signals Di and Dj that reflect the corrected gamma value gm' to the first pixels PX1 and the second pixels PX2.

Consequently, the first pixels PX1 and/or the second pixels PX2 that receive data signals Di and Dj reflecting the correction value of the pixel value Δpv and the correction value of the gamma value Δgm emit light at a corrected luminance. Correction is made such that the white color coordinate of the first display area DA1 is equal to the white color coordinate of the second display area DA2. This way, an image quality heterogeneity between the two display areas, in other words, the first display area DA1 and the second display area DA2 may be prevented or minimized and display quality may be improved.

As described with reference to FIGS. 6A and 6B, the white color coordinate of the first display area DA1 may be obtained based on the external light characteristic, the external light reflection characteristic of the first display area DA1, and the emission characteristic of the first display area DA1. In addition, the white color coordinate of the second display area DA2 may be obtained based on the external light characteristic, the external light reflection characteristic of the second display area DA2, and the emission characteristic of the second display area DA2.

As described above with reference to FIGS. 6A and 6B, the external light characteristic may include an external light spectrum, which is a luminance value depending on a wavelength of external light, and illuminance of external light, the external light reflection characteristic of the first display area DA1 may include a first reflection spectrum α1, which is a reflectivity depending on a wavelength of external light in the first display area DA1, and the external light reflection characteristic of the second display area DA2 may include a second reflection spectrum α2, which is a reflectivity depending on a wavelength of external light in the second display area DA2.

In addition, the emission characteristic of the first display area DA1 may include a first emission spectrum β1, which is a luminance value depending on a wavelength of light emitted by the first pixels PX1, and the emission characteristic of the second display area DA2 may include a second emission spectrum β2, which is a luminance value depending on a wavelength of light emitted by the second pixels PX2.

The first reflection spectrum α1 may be obtained based on an area ratio of the first emission area EA and the first non-emission area NEA1 of the first display unit DU1, and reflectivity of external light L in the first emission area EA and the first non-emission area NEA1 of the first display unit DU1. The second reflection spectrum α2 may be obtained based on an area ratio of the second emission area EA2, the second non-emission area NEA2, and the transmission area TA of the second display unit DU2, reflectivity of external light L in the second emission area EA2 and the second non-emission area NEA2 of the second display unit DU2, and reflectivity and a transmittance of external light L in the transmission area TA. The reflectivity of external light L from the electronic component 20 may also be used to obtain the second reflection spectrum α2.

Since the first pixels PX1 arranged in the first display area DA1 of the display panel 10 include the first display units DU1 repeatedly arranged two-dimensionally, if a first external light reflection characteristic and a first emission characteristic of the first display unit DU1 are obtained, a first external light reflection characteristic and a first emission characteristic of the entire first display area DA1 may be obtained.

In addition, since the second pixels PX2 arranged in the second display area DA2 of the display panel 10 include the second display units DU2 repeatedly arranged two-dimensionally, if a second external light reflection characteristic and a second emission characteristic of the second display unit DU2 are obtained, a second external light reflection characteristic and a second emission characteristic of the entire second display area DA2 may be obtained.

Consequently, if the external light reflection characteristics and the emission characteristics of the first display unit DU1 and the second display unit DU2 are obtained and repeated arrangement configurations of the first display unit DU1 and the second display unit DU2 that may change depending on a particular design are obtained, external light reflection characteristics and emission characteristics of the entire display area DA of the display panel 10 may be obtained.

This way, the external light reflection characteristic and the emission characteristic of each display area may be efficiently obtained, and furthermore, white color coordinates, ratio of correction of luminances, correction values of a pixel value Δpv, and correction values of a gamma value Δgm of the display areas, in other words, the first display area DA1 and the second display area DA2 may be efficiently obtained.

Figure 10:
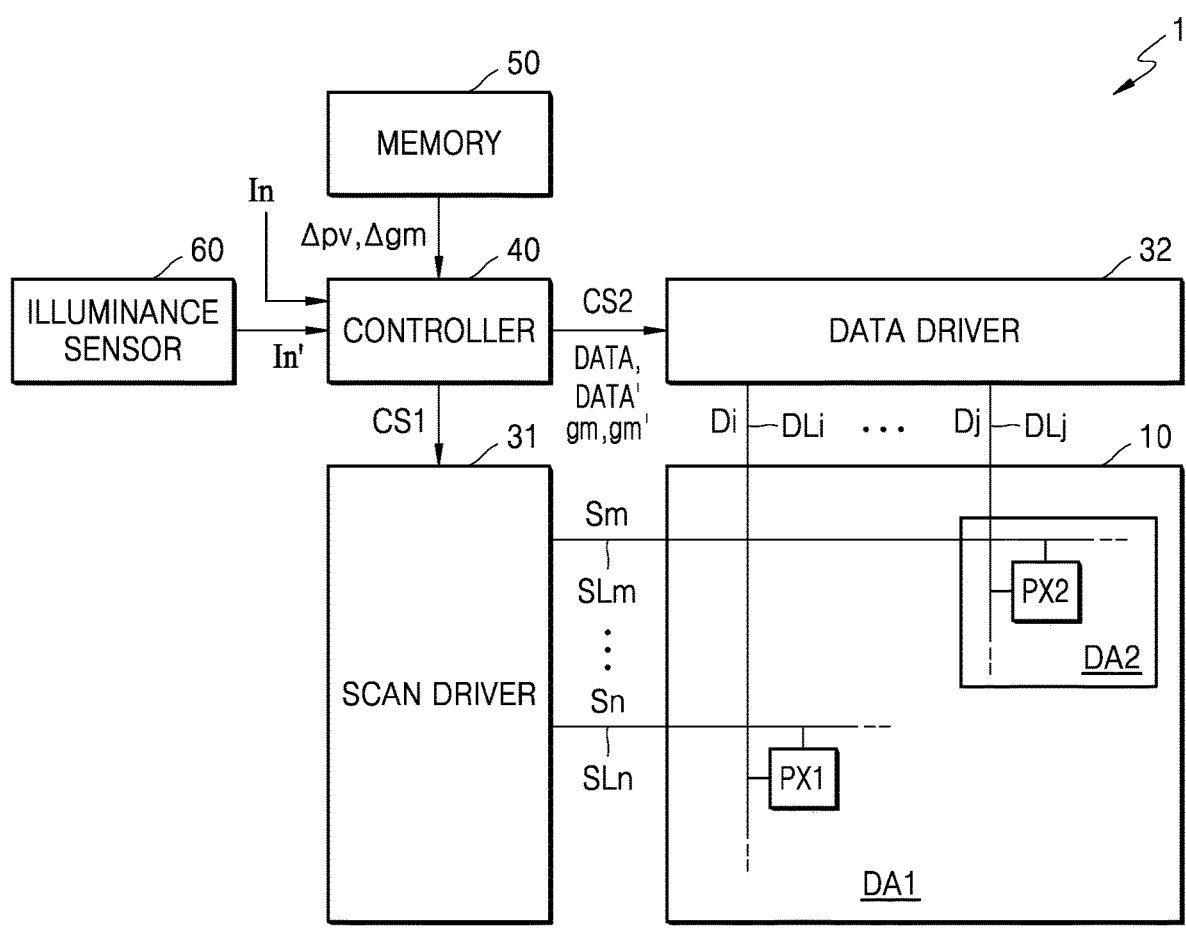
FIG. 10 is a block diagram of a structure of a display device according to another exemplary embodiment of the inventive concept.

FIG. 10 is a block diagram of a structure of the display device 1 according to another exemplary embodiment of the inventive concept. Hereinafter, differences from the structure of FIG. 9 are mainly described.

Referring to FIG. 10, in an exemplary embodiment of the inventive concept, the display device 1 may further include an illuminance sensor 60 for measuring the illuminance of external light. The controller 40 may receive an input value In' for the illuminance of external light from the illuminance sensor 60. The input value In' may be included in the input signal In or provided to the controller 40 as a separate signal.

The controller 40 may automatically receive the input value In' without a user having to manually adjust the input value In' for the illuminance of external light. In other words, the illuminance sensor 60 may function independent of user input. This way, user convenience may be improved. In addition, since the controller 40 may obtain an accurate input value In' for the illuminance of external light from the illuminance sensor 60, the controller 40 may load an optimized correction value of a pixel value Δpv and an optimized correction value of a gamma value Δgm and thus improve display quality.

Figure 11:
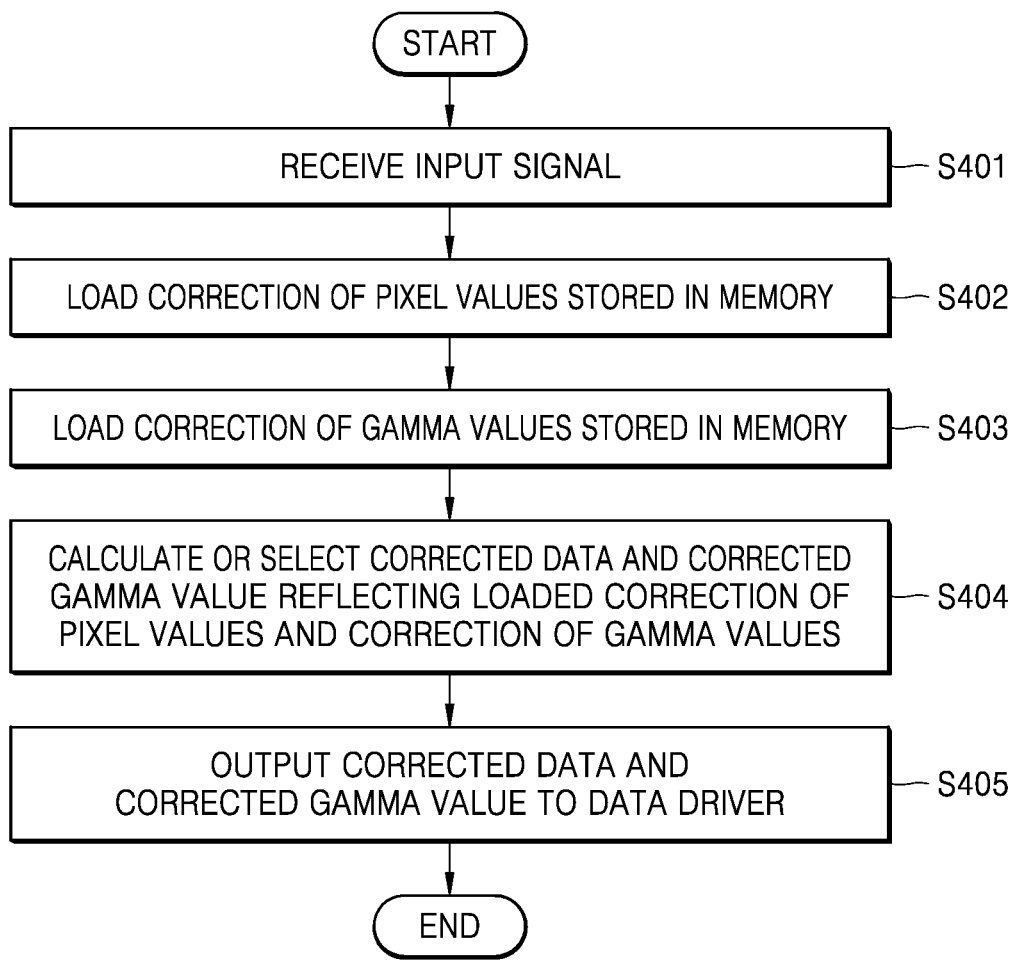
FIG. 11 is a flowchart for explaining an operating method of a controller of a display device according to an exemplary embodiment of the inventive concept.

FIG. 11 is a flowchart for explaining a method of operating the controller 40 of the display device 1 according to an exemplary embodiment of the inventive concept. FIG. 11 may include an operation of the controller 40 for the display device 1 of FIG. 9 to display an image.

Referring to FIG. 11, in an exemplary embodiment of the inventive concept, the controller 40 may receive an input signal In including an external light characteristic (operation S401). The external light characteristic may include information such as an external light spectrum λ and/or the illuminance of external light. The input signal In may include input data related to pixel values pv of the first pixels PX1 of the first display area DA1 and the second pixels PX2 of the second display area DA2.

The controller 40 may extract an external light characteristic from the input signal In and load correction values of a pixel value Δpv from the memory 50. The correction values of the pixel value Δpv loaded by the controller 40 correspond to the external light characteristic of the pixel value Δpv and are among correction values of the pixel value Δpv stored in memory 50. The correction values of the pixel value Δpv may be used to correct the pixel values pv of the first pixels PX1 of the first display area DA1 and the second pixels PX2 of the second display area DA2, the pixel values pv being included in image data DATA. The luminance of the pixels PX may be changed by correcting the pixel value pv.

The controller 40 may load correction values of a gamma value Δgm corresponding to the external light characteristic extracted from the input signal In among correction values of a gamma value Δgm stored in the memory 50 (operation S403). The correction value of the gamma value Δgm may be used to correct a gamma value gm set in advance. A response of the luminance of pixels PX for the pixel value pv that is input may be changed by correcting the gamma value gm.

The controller 40 may calculate or select corrected data DATA' that reflects the correction values of the pixel value Δpv loaded from the memory 50 to image data DATA corresponding to the input data. In addition, the controller 40 may calculate or select a corrected gamma value gm' that reflects the correction value of the gamma value Δgm loaded from the memory 50 to a gamma value set in advance (operation S404).

The controller 40 may output the corrected data DATA' and the corrected gamma value gm' to the data driver 32 (operation S405). The data driver 32 may receive the corrected data DATA' from the controller 40, convert the corrected data DATA' to data signals Di and Dj of a voltage or current form, and output the data signals Di and Dj to at least one of the first pixels PX1 and the second pixels PX2.

In the case of an external light illuminance among the external light characteristics, a user may directly give an input corresponding to the external light illuminance through an interface, or the illuminance sensor 60 of the display device 1 may obtain the external light illuminance by measuring the external light illuminance. In addition, in the case of an external light spectrum λ among the external light characteristics, a user may directly give an input corresponding to the external light spectrum through an interface, or a spectroscope of the display device 1 may obtain the external light spectrum by measuring the external light spectrum.

Figure 12A:
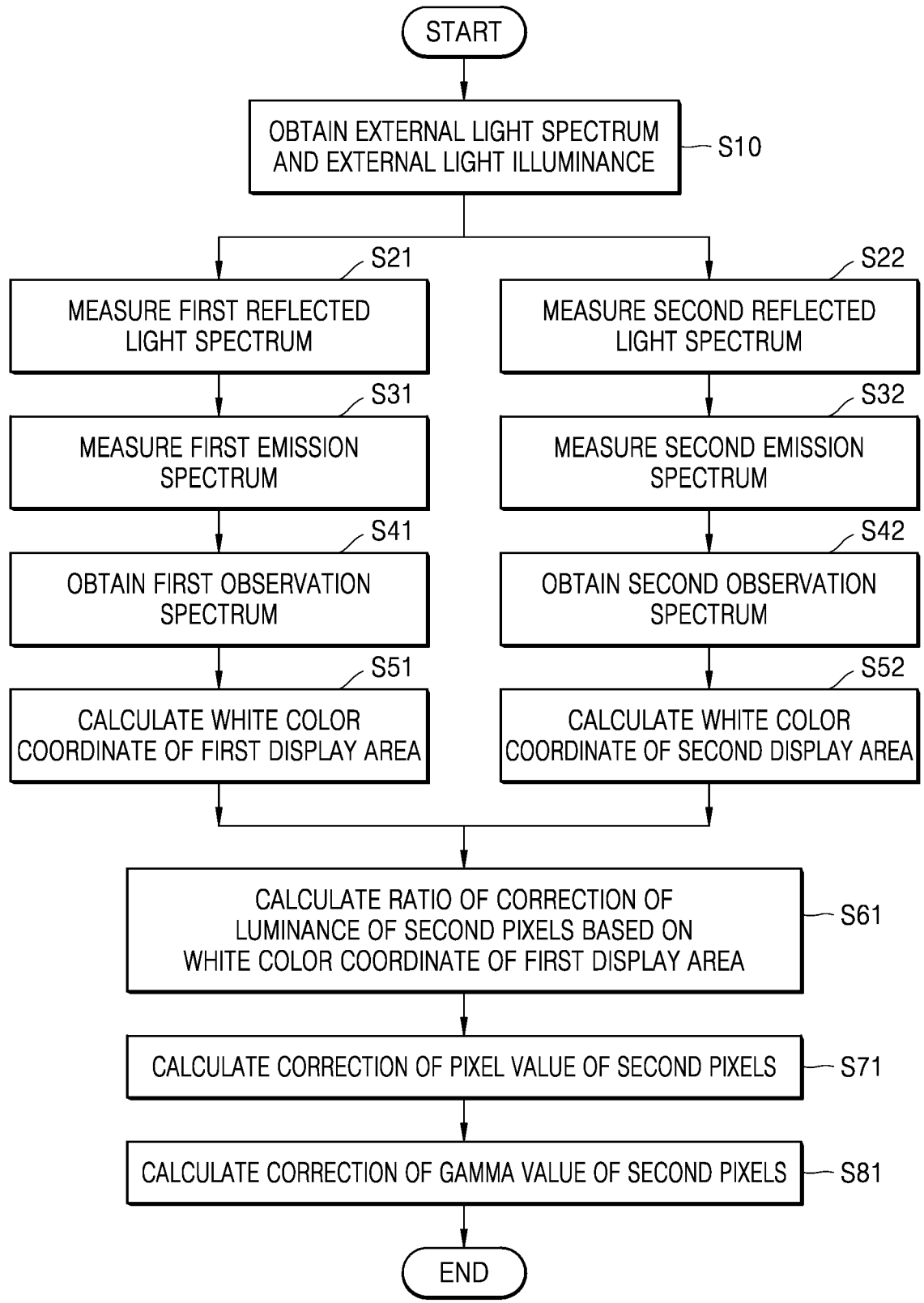
FIGS. 12A and 12B are flowcharts for explaining a method of obtaining a correction value of a pixel value and a correction value of a gamma value according to an exemplary embodiment of the inventive concept.
Figure 12B:
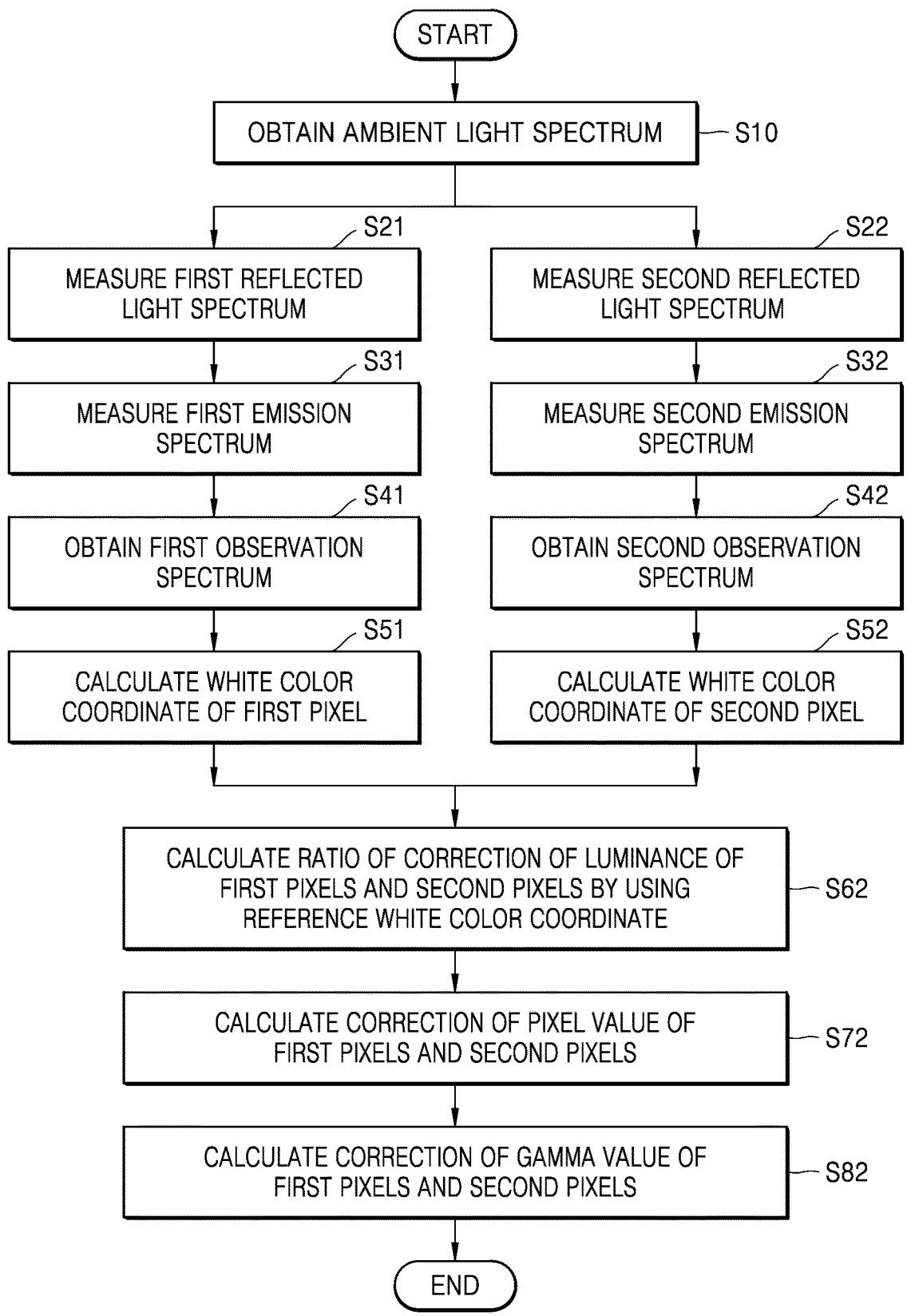

FIGS. 12A and 12B are flowcharts for explaining a method of obtaining a correction value of a pixel value and a correction value of a gamma value of the display device 1 according to an exemplary embodiment of the inventive concept. The method of obtaining correction values of a pixel value Δpv and correction values of a gamma value Δgm according to an exemplary embodiment is described in detail with reference to FIGS. 12A and 12B.

Referring to operation S10 in FIG. 12A, external light characteristics including an external light spectrum λ and external light illuminance may be measured or obtained first. The external light characteristics may be obtained by using an illuminance measuring instrument, a spectroscope, etc. or may be data known in advance.

In reference to FIGS. 4A, 7 and 12, in operation S21, with respect to the first display unit DU1 of the first display area DA1, an area ratio ARp1 of the first emission area EA1; an area ratio ARd1 of the first non-emission area NEA1; reflectivity Rp1 of the first emission area EA1; and reflectivity Rd1 of the first non-emission area NEA1 may be measured. In other words, a first reflected light spectrum may be measured. A reflection measuring instrument may be used for measuring the reflectivities Rp1 and Rd1. The area ratio ARp1 and the reflectivity Rp1 of the first emission area EA1 may be obtained for each color, for example, each red, green, and blue of the first pixel PX1 of the first emission area EA1.

The area ratio ARp1 of the first emission area EA1 may be a sum of areas of the first emission areas EA1 of the first pixels PX1 included in the first display unit DU1 relative to a total area of the first display unit DU1. For example, in the case of the first display unit DU1 shown in FIG. 4A, though the area ratio ARp1 of the first emission area EA1 may be a sum of areas of the first emission areas EA1 of 32 first pixels PX1 relative to a total area of the first display unit DU1, the inventive concept is not limited thereto.

An area ratio ARd1 of the first non-emission area NEA1 may be a sum of areas of first non-emission areas NEA1 included in the first display unit DU1 relative to a total area of the first display unit DU1. For example, a sum of the area ratio ARp1 of the first emission area EA1 and the area ratio ARd1 of the first non-emission area NEA1 may be 1.

Reflectivity Rp1 of the first emission area EA may be a luminance ratio of reflected light RLp1 reflected from one surface of the first emission area EA1 relative to a total luminance of external light L incident to the first emission area EA per the same area. The one surface of the first emission area EA from which the light is reflected may be a surface of the pixel electrode 210.

Reflectivity Rd1 of the first non-emission area NEA1 may be a luminance ratio of reflected light RLd1 reflected from one surface of the first non-emission area NEA1 relative to a total luminance of external light L incident to the first non-emission area NEA1 per the same area. The one surface of the first non-emission area NEA1 from which the light is reflected may be a surface of the pixel-defining layer 119. The surface of the pixel defining layer 119 may be higher than the surface of the pixel electrode 210.

For example, a first reflection spectrum $α1'$ of the first display unit DU1 may be obtained by using Equation 1 below based on the external light spectrum λ, the area ratios ARp1 and ARd1 and the reflectivities Rp1 and Rd1.

$$α1'=λ×(Rp1×ARp1+Rd1×ARd1) \qquad \text{Equation (1)}$$

In this case, the first reflection spectrum $α1$ of the entire first display area DA1 may be obtained by taking into account the arrangement of the first display units DU1 in the first display area DA1.

Referring to operation S31, the first emission spectrum $β1$ may be obtained by measuring light B1 emitted from the first pixels PX1 in the first display area DA1. A spectroscope may be used for measuring the first emission spectrum P1. The first emission spectrum $β1$ may be an emission spectrum of each of a first red pixel Pr1, a first green pixel Pg1, and a first blue pixel Pb, the emission spectrum being measured in the case where the first red pixel Pr1, the first green pixel Pg1, and the first blue pixel Pb1 emit light of a primary color of the display device 1, for example, emit light having RGB three primary colors to express a white color.

Referring to operation S41, a first observation spectrum $φ1$ of the first display area DA1 may be obtained by using Equation 2 below.

$$φ1=α1+β1 \qquad \text{Equation (2)}$$

Referring to operation S51, a white color coordinate (W1x, W1y) of the first display area DA1 may be calculated by using the first observation spectrum $φ1$. Table 1 below shows examples of a white color coordinate depending on illuminance of the first display area DA1 under sunlight.

TABLE 1

| Illuminance [lx] | W1x | W1y |
|---|---|---|
| 1000 | 0.282 | 0.291 |
| 6000 | 0.293 | 0.296 |
| 10000 | 0.300 | 0.300 |

Referring to operation S22, with respect to the second display unit DU2 of the second display area DA2, an area ratio ARp2 of the second emission area EA2; an area ratio ARd2 of the second non-emission area NEA2; an area ratio ARta of the transmission area TA; a reflectivity Rp2 of the second emission area EA2; a reflectivity Rd2 of the second non-emission area NEA2; a reflectivity Rt of the transmission area TA; a transmittance TR of the transmission area TA; and a reflectivity Rc of light that passes through the transmission area TA in the electronic component 20 may be measured. In other words, a second reflected light spectrum may be measured. A reflectivity measuring instrument may be used for measuring the reflectivities Rp2, Rd2, Rt, and Rc, and a transmission measuring instrument may be used for measuring the transmittance TR. The area ratio ARp2 and the reflectivity Rp2 of the second emission area EA2 may be obtained for each color of the second pixel PX2 of the second emission area EA2, for example, red, green, and blue.

The area ratio ARp2 of the second emission area EA2 may be a sum of areas of the second emission areas EA2 of the second pixels PX2 included in the second display unit DU2 relative to a total area of the second display unit DU2. For example, in the case of the second display unit DU2 shown in FIG. 4B, though the area ratio ARp2 of the second emission area EA2 may be a sum of areas of the second emission areas EA2 of 8 second pixels PX2 relative to a total area of the second display unit DU2, the inventive concept is not limited thereto.

An area ratio ARd2 of the second non-emission area NEA2 may be a sum of areas of second non-emission areas NEA2 included in the second display unit DU2 relative to a total area of the second display unit DU2.

An area ratio ARta of the transmission area TA may be a sum of areas of the transmission areas TA included in the second display unit DU2 relative to a total area of the second display unit DU2. For example, a sum of the area ratio ARp2 of the second emission area EA2, the area ratio ARd2 of the second non-emission area NEA2, and the area ratio ARta of the transmission area TA may be 1.

Reflectivity Rp2 of the second emission area EA2 may be a luminance ratio of reflected light RLp2 reflected from one surface of the second emission area EA2 relative to a total luminance of external light L incident to the second emission area EA2 per the same area. The one surface of the second emission area EA2 from which the light is reflected may be a surface of the pixel electrode 210.

Reflectivity Rd2 of the second non-emission area NEA2 may be a luminance ratio of reflected light RLd2 reflected from one surface of the second non-emission area NEA2 relative to a total luminance of external light L incident to the second non-emission area NEA2 per the same area. The one surface of the second non-emission area NEA2 from which the light is reflected may be a surface of the pixel-defining layer 119.

The reflectivity Rt of the transmission area TA may be a luminance ratio of reflected light RLt reflected from one surface of the transmission area TA relative to a total luminance of external light L incident to the transmission area TA per the same area. The one surface of the transmission area TA may be a surface of the substrate 100. For example, the one surface of the transmission area TA may be the first surface of the substrate 100.

Transmittance TR of the transmission area TA may be a luminance ratio of light that passes through the transmission area TA without being reflected from one surface of the transmission area TA relative to a total luminance of external light L incident to the transmission area TA per same area.

The reflectivity Rc of light that passes through the transmission area TA from the electronic component 20 may be a luminance ratio of the reflected light RLc reflected from one surface of the electronic component 20 relative to a total luminance of light incident to the electronic component 20 in the transmission area TA per the same area.

For example, a second reflection spectrum α2' of the second display unit DU2 may be obtained by using Equation 3 below based on the external light spectrum λ, the area ratios ARp2 and ARd2 and the reflectivities Rp2, Rd2, Rt, and Rc, and the transmittance TR.

$$\alpha 2' = \lambda \times \{Rp2 \times ARp2 + Rd2 \times ARd2 + (Rt + TR^2 \times Rc) \times ARta\}$$ Equation (3)

In this case, the second reflection spectrum α2 of the entire second display area DA2 may be obtained by taking into account the arrangement of the second display units DU2 in the second display area DA2.

Referring to operation S32, the second emission spectrum P2 may be obtained by measuring light B2 emitted from the second pixels PX2 in the second display area DA2. A spectroscope may be used for measuring the second emission spectrum β2.

Referring to operation S42, a second observation spectrum β2 of the second display area DA2 may be obtained by using Equation 4 below.

$$\alpha 2 = \alpha 2 + \beta 2$$ Equation (4)

Referring to operation S52, a white color coordinate and color coordinates Rx, Ry, Gx, Gy, Bx, and By respectively of a second red pixel Pr2, a second green pixel Pg2, and a second blue pixel Pb2 of the second display area DA2 may be calculated by using the second observation spectrum β2. Table 2 below shows examples of color coordinates of the second red pixel Pr2, the second green pixel Pg2, and the second blue pixel Pb2 depending on illuminance of the second display area DA2 under sunlight.

TABLE 2

| Illuminance [lx] | Rx | Ry | Gx | Gy | Bx | By |
|---|---|---|---|---|---|---|
| 0 | 0.688 | 0.312 | 0.201 | 0.744 | 0.141 | 0.041 |
| 1000 | 0.658 | 0.322 | 0.226 | 0.708 | 0.159 | 0.062 |
| 6000 | 0.576 | 0.349 | 0.300 | 0.600 | 0.222 | 0.136 |
| 10000 | 0.545 | 0.359 | 0.331 | 0.556 | 0.255 | 0.175 |

Referring to operation S61, in an exemplary embodiment of the inventive concept, a ratio of correction of luminance of the second pixels PX2 may be calculated. For example, the ratio of correction of luminance of the second pixels PX2 may be based on the white color coordinate of the first display are DA1. The ratio of correction of luminance of the second pixels PX2, which makes a white color coordinate of the second display area DA2 equal to a white color coordinate of the first display area DA1, is obtained as described above. Table 3 below shows examples of a ratio of correction of luminance depending on the illuminance of the second red pixel Pr2, the second green pixel Pg2, and the second blue pixel Pb2 under sunlight.

TABLE 3

| Illuminance [lx] | Ratio of correction of luminance of Pr2 [%] | Ratio of correction of luminance of Pg2 [%] | Ratio of correction of luminance of Pb2 [%] |
|---|---|---|---|
| 0 | 24.2 | 68.6 | 7.2 |
| 1000 | 20.0 | 44.1 | 7.2 |
| 6000 | 8.1 | 15.6 | 7.2 |
| 10000 | 4.0 | 11.3 | 7.2 |

Referring to operation S71, a correction value of a pixel value Δpv of the second pixels PX2 may be calculated based on a ratio of correction of luminance of the second pixels PX2. Table 4 below shows corrected data DATA' that reflects a correction value of a pixel value Δpv in the case where a gamma value is 2.2.

TABLE 4

| Illuminance [lx] | Pixel value of Pr2 | Pixel value of Pg2 | Pixel value of Pb2 |
|---|---|---|---|
| 0 | 255 | 255 | 255 |
| 1000 | 235 | 209 | 255 |
| 6000 | 156 | 131 | 255 |
| 10000 | 113 | 113 | 255 |

In addition, referring to operation S81, a correction value of a gamma value Δgm of the second pixels PX2 may be calculated based on a ratio of correction of luminance of the second pixels PX2. In an exemplary embodiment of the inventive concept, the correction value of the gamma value Δgm may include a luminance increase and decrease rate. Table 5 below shows a luminance ratio of white color and a correction value of a gamma value Δgm depending on illuminance in the second display area DA2.

TABLE 5

| Illuminance [lx] | In the second display area luminance ratio of White color [%] | Gamma correction ratio [%] |
|---|---|---|
| 0 | 100.0 | 100 |
| 1000 | 71.3 | 140 |
| 6000 | 31.0 | 323 |
| 10000 | 22.5 | 444 |

Since operations S10, S21 to S51 and S22 to S52 in FIG. 12B are substantially the same as those described with reference to FIG. 12A, differences are mainly described.

Referring to operation S62 in FIG. 12B, in another exemplary embodiment of the inventive concept, a reference white color coordinate may be used. For example, a reference white color coordinate (Wrx, Wry) may be (0.28, 0.29). A ratio of correction of luminance of the first pixels PX1 and the second pixels PX2 may be calculated by using the reference white color coordinate, such that the ratio of correction of luminance of the first pixels PX1 and the second pixels PX2 making the white color coordinate of the first display area DA1 and the white color coordinate of the second display area DA2 equal to the reference white color coordinate.

Table 6 shows examples of color coordinates of a red pixel (Pr1, Pr2), a green pixel (Pg1, Pg2), and a blue pixel (Pb1, Pb2) depending on illuminance of the first display area DA1 and the second display area DA2 under sunlight.

TABLE 6

| | Illuminance [lx] | Rx | Ry | Gx | Gy | Bx | By |
|---|---|---|---|---|---|---|---|
| Second display area | 0 | 0.688 | 0.312 | 0.201 | 0.744 | 0.141 | 0.041 |
| | 1000 | 0.658 | 0.322 | 0.226 | 0.708 | 0.159 | 0.062 |
| | 6000 | 0.576 | 0.349 | 0.300 | 0.600 | 0.222 | 0.136 |
| | 10000 | 0.545 | 0.359 | 0.331 | 0.556 | 0.255 | 0.175 |
| First display area | 0 | 0.688 | 0.312 | 0.201 | 0.744 | 0.141 | 0.041 |
| | 1000 | 0.665 | 0.315 | 0.215 | 0.717 | 0.151 | 0.053 |
| | 6000 | 0.590 | 0.325 | 0.263 | 0.623 | 0.191 | 0.099 |
| | 10000 | 0.556 | 0.329 | 0.287 | 0.577 | 0.214 | 0.127 |

Table 7 below shows examples of a bright correction ratio depending on illuminance of a second red pixel Pr2, a second green pixel Pg2, and a second blue pixel Pb2 under sunlight.

TABLE 7

| | Illuminance [lx] | Ratio of correction of luminance of Pr [%] | Ratio of correction of luminance of Pg [%] | Ratio of correction of luminance of Pb [%] |
|---|---|---|---|---|
| Second display area | 0 | 24.2 | 68.6 | 7.2 |
| | 1000 | 19.6 | 43.0 | 7.2 |
| | 6000 | 7.6 | 14.9 | 7.2 |
| | 10000 | 0.2 | 9.9 | 7.2 |
| First display area | 0 | 24.2 | 68.6 | 7.2 |
| | 1000 | 23.4 | 52.3 | 7.2 |
| | 6000 | 11.8 | 24.6 | 7.2 |
| | 10000 | 4.2 | 17.8 | 7.2 |

Referring to operation S72, a correction value of a pixel value Δpv of the first pixels PX1 and the second pixels PX2 may be calculated based on a ratio of correction of luminance of the first pixels PX1 and the second pixels PX2. Table 8 below shows corrected data DATA' that reflects a correction value of a pixel value Δpv in the case where a gamma value is 2.2.

TABLE 8

| | Illuminance [lx] | Pixel value of Pr2 | Pixel value of Pg2 | Pixel value of Pb2 |
|---|---|---|---|---|
| Second display area | 0 | 255 | 255 | 255 |
| | 1000 | 232 | 207 | 255 |
| | 6000 | 151 | 128 | 255 |
| | 10000 | 26 | 106 | 255 |
| First display area | 0 | 255 | 255 | 255 |
| | 1000 | 252 | 226 | 255 |
| | 6000 | 185 | 161 | 255 |
| | 10000 | 116 | 138 | 255 |

In addition, referring to operation S82, a correction value of a gamma value Δgm of the first pixels PX1 and the second pixels PX2 may be calculated based on a ratio of correction of luminance of the first pixels PX1 and the second pixels PX2. Table 9 shows a luminance ratio of white color and a gamma correction ratio depending on illuminance in the first display area DA1 and the second display area DA2.

TABLE 9

| | Illuminance [lx] | luminance ratio of White color [%] | Gamma correction ratio [%] |
|---|---|---|---|
| Second display area | 0 | 100.10 | 100 |
| | 1000 | 69.8 | 143 |
| | 6000 | 29.7 | 336 |
| | 10000 | 17.3 | 578 |
| First display area | 0 | 100.0 | 100 |
| | 1000 | 82.9 | 121 |
| | 6000 | 43.7 | 229 |
| | 10000 | 29.2 | 342 |

In an exemplary embodiment of the inventive concept, an image quality heterogeneity that may occur between the first display area DA1 and the second display area DA2 may be prevented or minimized. This, display quality may be improved. Particularly, in an exemplary embodiment of the inventive concept, in the case where illuminance of external light is 10,000 lx or less, a difference (ΔWx, ΔWy) in a corrected white color coordinate between two display areas, in other words, the first display area DA1 and the second display area DA2, may be within 0.003. This may be a degree of difference of color that is difficult for human eyes to distinguish. In other words, this minute color difference may not be observed by a user of the display device 1, for example.

Table 10 shows examples of a corrected white color coordinate (W1x, W1y) of the first display area DA1, a corrected white color coordinate (W2x, W2y) of the second display area DA2, and a difference (ΔWx, ΔWy) of a corrected white color coordinate between the two display areas, in other words, the first display area DA1 and the second display area DA2.

TABLE 10

| Illuminance [lx] | W1x | W1y | W2x | W2y | ΔWx | ΔWy |
|---|---|---|---|---|---|---|
| 0 | 0.280 | 0.290 | 0.280 | 0.290 | 0.000 | 0.000 |
| 1000 | 0.282 | 0.293 | 0.282 | 0.294 | 0.000 | 0.001 |
| 6000 | 0.291 | 0.296 | 0.293 | 0.297 | 0.002 | 0.001 |
| 10000 | 0.321 | 0.309 | 0.323 | 0.312 | 0.002 | 0.003 |

According to an exemplary embodiment of the inventive concept, a display device including an extended display area in which an image may be expressed even though it includes a region in which an electronic component is arranged, and a method of operating a controller of the display device may be implemented.

Particularly, an image quality heterogeneity between a region where an electronic component is arranged and a region where an electronic component is not arranged is prevented or minimized. An image quality heterogeneity may be prevented or minimized even under changing environments by adjusting a white color coordinate of pixels arranged in each area in response to changes in the illuminance of external light. This, display quality may be improved. However, the scope of the inventive concept is not limited by this effect.

The above described exemplary embodiments may be implemented by using a system, a method, a computer program, or a combination of a system, method, and computer program.

It should be understood that the embodiments described herein should be considered limiting. Descriptions of features or aspects within each embodiment may be considered available for other similar features or aspects in other embodiments. While one or more embodiments of the inventive concept have been described with reference to the figures, it will be understood by those of ordinary skill in the art that various changes in form and details may be made thereto without departing from the spirit and scope as set forth by the following claims.

What is claimed is:

1. An operating method of a controller, the operating method comprising:
   receiving, at the controller, an input of an external light characteristic;
   loading, at the controller, correction values of a pixel value corresponding to the input among the correction values of the pixel value stored in a memory;
   loading, at the controller, correction values of a gamma value corresponding to the input among correction values of the gamma value stored in the memory;
   generating, at the controller, corrected data by correcting at least one of a first image data of first pixels and a second image data of second pixels based on the input and the loaded correction values of the pixel value, and outputting the corrected data to a data driver; and
   outputting, from the controller, a corrected gamma value reflecting the correction value of the gamma value to a gamma value set in advance to the data driver,
   wherein the correction value of the pixel value comprises a pixel function value for illuminance of external light with respect to at least one of the first pixels and the second pixels, the pixel function value making a white color coordinate of a first display area equal to a white color coordinate of a second display area based on an external light characteristic, an external light reflection characteristic of the first display area and the second display area, and an emission characteristic of the first display area and the second display area,
   wherein the display device comprises: a display panel comprising a first display area and a second display area, the first display area comprising first display units comprising the first pixels and the second display area comprising second display units comprising the second pixels and a transmission area; the memory, the controller and the data driver,
   wherein the external light reflection characteristic of the first display area comprises a first reflection spectrum, which is a reflectivity depending on a wavelength of the external light in the first display area, and
   the external light reflection characteristic of the second display area comprises a second reflection spectrum, which is a reflectivity depending on a wavelength of the external light in the second display area.

2. The operating method of claim 1, wherein the correction values of the pixel value comprise values that are obtained based on a ratio of correction of luminance of the second pixels that makes the white color coordinate of the second display area equal to the white color coordinate of the first display area, and
   the correction values of the gamma value comprise correction values of a gamma value of the second display area that obtained based on a ratio of correction of luminance of the second pixels.

3. The operating method of claim 1, wherein the correction values of the pixel value comprise correction values of a pixel value that are obtained based on a ratio of correction of luminance of the first pixels and correction values of a pixel value that are obtained based on a ratio of correction of luminance of the second pixels, wherein the ratio of correction of luminance of the first pixels and the ratio of correction of luminance of the second pixels each make the white color coordinate of the first display area and the white color coordinate of the second display area equal to a reference white color coordinate, and
   the correction values of the gamma value comprise correction values of a gamma value of the first display area that are obtained based on the ratio of correction of luminance of the first pixels and correction values of a gamma value of the second display area that are obtained based on the ratio of correction of luminance of the second pixels.

4. The operating method of claim 1, wherein the external light characteristic comprises an external light spectrum and illuminance of external light, wherein the external light spectrum is a luminance value depending on a wavelength of external the light,
   the emission characteristic of the first display area comprises a first emission spectrum, which is a luminance value depending on a wavelength of light emitted by the first pixels, and
   the emission characteristic of the second display area comprises a second emission spectrum, which is a luminance value depending on a wavelength of light emitted by the second pixels.

5. The operating method of claim 4, wherein each of the first display unit and the second display unit comprises an emission area and a non-emission area, the emission area emitting light, and the non-emission area surrounding the emission area,
   the first reflection spectrum is obtained based on an area ratio of the emission area and the non-emission area of the first display unit, and a reflectivity of the external light in the emission area and the non-emission area of the first display unit, and
   the second reflection spectrum is obtained based on an area ratio of the emission area, the non-emission area, and the transmission area of the second display unit, a reflectivity of the external light in the emission area and the non-emission area of the second display unit, and a reflectivity and transmittance of the external light in the transmission area.

6. The operating method of claim 5, wherein the white color coordinate of the first display area is obtained based on the external light characteristic, the external light reflection characteristic of the first display area, and the emission characteristic of the first display area, and
   the white color coordinate of the second display area is obtained based on the external light characteristic, the external light reflection characteristic of the second display area, and the emission characteristic of the second display area.

7. A display device comprising:
   a display panel comprising a first display area and a second display area, the first display area comprising first pixels and the second display area comprising second pixels and a transmission area;
   a memory storing correction values of a pixel value;
   a controller generating corrected data by correcting image data based on the correction values of the pixel value provided from the memory; and
   a data driver outputting a data signal corresponding to the corrected data to the display panel,
   wherein at least one of the correction values of the pixel value comprises a pixel function value for illuminance of external light with respect to at least one of the first pixels and the second pixels, wherein the pixel function value makes a white color coordinate of the first display area equal to a white color coordinate of the second display area based on an external light characteristic and at least one of an external light reflection characteristic of the first display area, an external light reflection characteristic of the second display area, an emission characteristic of the first display area and an emission characteristic of the second display area,
   wherein the at least one of the correction values of the pixel value comprises correction values of a pixel value obtained based on a ratio of correction of luminance of the first pixels and correction values of a pixel value obtained based on a ratio of correction of luminance of the second pixels, wherein the ratio of correction of luminance of the first pixels and the ratio of correction of luminance of the second pixels each make the white color coordinate of the first display area and the white color coordinate of the second display area equal to a reference white color coordinate.

8. A display device comprising:
   a display panel comprising a first display area and a second display area, the first display area comprising first pixels and the second display area comprising second pixels and a transmission area;
   a memory storing correction values of a pixel value;
   a controller configured to generate corrected data by correcting image data based on the correction values of the pixel value provided from the memory; and
   a data driver outputting a data signal corresponding to the corrected data to the display panel,
   wherein at least one of the correction values of the pixel value comprises a pixel function value for illuminance of external light with respect to at least one of the first pixels and the second pixels, wherein the pixel function value makes a white color coordinate of the first display area equal to a white color coordinate of the second display area based on an external light characteristic, an external light reflection characteristic of the first display area and the second display area, and an emission characteristic of the first display area and the second display area,
   wherein the external light reflection characteristic of the first display area comprises a first reflection spectrum, which is a reflectivity depending on a wavelength of the external light in the first display area, and
   the external light reflection characteristic of the second display area comprises a second reflection spectrum, which is a reflectivity depending on a wavelength of the external light in the second display area.

9. The display device of claim 8, wherein the correction values of the pixel value comprise values that are obtained based on a ratio of correction of luminance of the second pixels that makes the white color coordinate of the second display area equal to the white color coordinate of the first display area.

10. The display device of claim 9, wherein the controller is further configured to
    output first image data of the first pixels to the data driver,
    generate corrected data by correcting second image data of the second pixels based on an input value for the illuminance of external light and a correction value of a pixel value corresponding to the input value, and
    output the corrected data to the data driver.

11. The display device of claim 10, wherein the memory stores correction values of a gamma value, wherein the correction values of the gamma value comprise correction values of a gamma value of the second display area that are obtained based on the ratio of correction of luminance of the second pixels.

12. The display device of claim 11, wherein the controller is further configured to simultaneously load the correction value of the gamma value corresponding to the input value from the memory and output a corrected gamma value reflecting the correction value of the gamma value corresponding to the input value to a gamma value set in advance to the data driver, and
    the data driver outputs a data signal reflecting the corrected gamma value to the corrected data to the second pixels.

13. The display device of claim 8, wherein the correction values of the pixel value comprise correction values of a pixel value obtained based on a ratio of correction of luminance of the first pixels and correction values of a pixel value obtained based on a ratio of correction of luminance of the second pixels, wherein the ratio of correction of luminance of the first pixels and the ratio of correction of luminance of the second pixels each make the white color coordinate of the first display area and the white color coordinate of the second display area equal to a reference white color coordinate.

14. The display device of claim 13, wherein the controller is further configured to
    generate first corrected data by correcting first image data of the first pixels based on an input value of illuminance of external light and a correction value of a pixel value corresponding to the input value and output the first corrected data to the data driver, and generate second corrected data by correcting second image data of the second pixels based on the input value of the illuminance of external light and the correction value of the pixel value corresponding to the input value and output the second corrected data to the data driver.

15. The display device of claim 14, wherein the memory further stores correction values of a gamma value, wherein the correction values of the gamma value comprise correction values of a gamma value of the first display area obtained based on the ratio of correction of luminance of the first pixels and correction values of a gamma value of the second display area obtained based on the ratio of correction of luminance of the second pixels.

16. The display device of claim 15, wherein the controller is further configured to simultaneously load the correction values of the gamma value stored in the memory, the correction values of the gamma value corresponding to the input value of illuminance of external light, and output corrected gamma values reflecting the correction values of the gamma value to gamma values set in advance to the data driver, and the data driver outputs a data signal reflecting the corrected gamma values to the corrected data to the first pixels and the second pixels.

17. The display device of claim 8, wherein the external light characteristic comprises an external light spectrum and illuminance of external light, wherein the external light spectrum is a luminance value depending on a wavelength of the external light, the emission characteristic of the first display area comprises a first emission spectrum, which is a luminance value depending on a wavelength of light emitted by the first pixels, and the emission characteristic of the second display area comprises a second emission spectrum, which is a luminance value depending on a wavelength of light emitted by the second pixels.

18. The display device of claim 17, further comprising:

a first display unit arranged in the first display area and comprising the first pixels; and a second display unit arranged in the second display area and comprising the second pixels and the transmission area around the second pixels, wherein no pixel is arranged in the transmission area, wherein each of the first display unit and the second display unit comprises an emission area and a non-emission area, the emission area emitting light, and the non-emission area surrounding the emission area, the first reflection spectrum is obtained based on an area ratio of the emission area and the non-emission area of the first display unit, and a reflectivity of the external light in the emission area and the non-emission area of the first display unit, and the second reflection spectrum is obtained based on an area ratio of the emission area, the non-emission area, and the transmission area of the second display unit, a reflectivity of the external light in the emission area and the non-emission area of the second display unit, and a reflectivity and transmittance of the external light in the transmission area.

19. The display device of claim 18, wherein the white color coordinate of the first display area is obtained based on the external light characteristic, the external light reflection characteristic of the first display area, and the emission characteristic of the first display area, and the white color coordinate of the second display area is obtained based on the external light characteristic, the external light reflection characteristic of the second display area, and the emission characteristic of the second display area.

20. The display device of claim 8, further comprising an illuminance sensor measuring illuminance of external light, wherein the controller is further configured to receive an input value of the illuminance of external light from the illuminance sensor.

21. The display device of claim 8, further comprising an electronic component overlapping the transmission area of the second display area.

* * * * *